US011469715B2

(12) United States Patent
Enomoto et al.

(10) Patent No.: US 11,469,715 B2
(45) Date of Patent: Oct. 11, 2022

(54) POWER AMPLIFIER CIRCUIT

(71) Applicant: Murata Manufacturing Co., Ltd., Kyoto (JP)

(72) Inventors: Jun Enomoto, Kyoto (JP); Kazuo Watanabe, Kyoto (JP); Satoshi Tanaka, Kyoto (JP); Yusuke Tanaka, Kyoto (JP); Makoto Itou, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 120 days.

(21) Appl. No.: 17/109,389

(22) Filed: Dec. 2, 2020

(65) Prior Publication Data

US 2021/0175857 A1  Jun. 10, 2021

(30) Foreign Application Priority Data

Dec. 5, 2019 (JP) .............................. JP2019-220660

(51) Int. Cl.
*H03F 1/22* (2006.01)
*H03F 1/32* (2006.01)
*H03F 3/21* (2006.01)

(52) U.S. Cl.
CPC .................. *H03F 1/32* (2013.01); *H03F 3/21* (2013.01); *H03F 2200/451* (2013.01)

(58) Field of Classification Search
CPC ..................................... H03F 1/22; H03F 1/30
USPC ......................................... 330/311, 296, 285
See application file for complete search history.

(56) References Cited

U.S. PATENT DOCUMENTS

| | | | |
|---|---|---|---|
| 9,306,500 B2* | 4/2016 | Takahashi | H03F 1/0211 |
| 9,647,656 B2 | 5/2017 | Masuda | |
| 11,043,922 B2* | 6/2021 | Watanabe | H03F 1/086 |
| 11,201,595 B2* | 12/2021 | Rogers | H03F 1/22 |
| 11,258,406 B2* | 2/2022 | Tanaka | H03F 1/0261 |
| 2018/0152143 A1 | 5/2018 | Tanaka et al. | |
| 2018/0316315 A1 | 11/2018 | Torii et al. | |

FOREIGN PATENT DOCUMENTS

| | | |
|---|---|---|
| CN | 106330109 A | 1/2017 |
| JP | 2018085689 A | 5/2018 |
| WO | 2017098578 A1 | 6/2017 |

* cited by examiner

*Primary Examiner* — Henry Choe
(74) *Attorney, Agent, or Firm* — Pearne & Gordon LLP

(57) ABSTRACT

A power amplifier circuit includes first and second bias circuits configured to provide first and second biases, respectively, a first transistor having an emitter connected to a reference potential, a base configured to receive the first bias via a first resistor and receive a radio-frequency input signal via a first capacitor, and a collector configured to output an amplified radio-frequency signal, a second transistor having a base connected to the reference potential via a second capacitor and configured to receive the second bias via a second resistor, an emitter configured to receive the radio-frequency signal, and a collector connected to a power supply potential via a third inductor and configured to output a radio-frequency output signal, and an impedance circuit having a first end connected to an output section of the second bias circuit and configured to apply an alternating-current signal to a path extending from the second bias circuit.

19 Claims, 25 Drawing Sheets

POWER AMPLIFIER CIRCUIT

CROSS REFERENCE TO RELATED APPLICATION

This application claims priority from Japanese Patent Application No. 2019-220660 filed on Dec. 5, 2019. The content of this application is incorporated herein by reference in its entirety.

BACKGROUND OF THE DISCLOSURE

Field of the Disclosure

The present disclosure relates to a power amplifier circuit.

Description of the Related Art

Japanese Unexamined Patent Application Publication No. 2018-85689 discloses a power amplifier circuit having a circuit configuration in which the collector of a first transistor and the emitter of a second transistor are connected via a capacitor. The power amplifier circuit disclosed in Japanese Unexamined Patent Application Publication No. 2018-85689 includes a first bias circuit and a second bias circuit corresponding to the first transistor and the second transistor, respectively. The first bias circuit applies a bias to the base of the first transistor via a resistor, and the second bias circuit applies a bias to the base of the second transistor via a resistor.

In the power amplifier circuit disclosed in Japanese Unexamined Patent Application Publication No. 2018-85689, an increase in the current amplitude of an alternating current (AC) signal inputted to the emitter of the second transistor causes an increase in base current, thereby increasing the voltage drop across the resistor connected to an output section of the second bias circuit. Thus, during a large-signal operation in which an output signal is relatively large, the base voltage of the second transistor decreases, making it difficult to keep the second transistor in the on state. As a result, gain compression occurs, which may lead to an increase in distortion in the output signal. The gain compression refers to a reduction in the degree of amplification caused by an increase in current amplitude, whereas the degree of amplification remains constant when the current amplitude is small.

BRIEF SUMMARY OF THE DISCLOSURE

Accordingly, it is an object of the present disclosure to implement a power amplifier circuit with improved input and output gain characteristics and reduced output signal distortion.

According to preferred embodiments of the present disclosure, a power amplifier circuit includes a first bias circuit configured to provide a first bias, a second bias circuit configured to provide a second bias, a first transistor having an emitter electrically connected to a reference potential, a base configured to receive the first bias via a first resistor and receive a radio-frequency input signal via a first capacitor, and a collector configured to output a radio-frequency signal obtained by amplifying the radio-frequency input signal, a second transistor having a base electrically connected to the reference potential via a second capacitor and configured to receive the second bias via a second resistor, a collector electrically connected to a first power supply potential via a third inductor, and an emitter configured to receive the radio-frequency signal, the collector being configured to output a radio-frequency output signal obtained by amplifying the radio-frequency signal, and an impedance circuit having a first end electrically connected to an output section of the second bias circuit, the impedance circuit being configured to apply a signal corresponding to the radio-frequency input signal to a path extending from the second bias circuit to the base of the second transistor.

According to preferred embodiments of the present disclosure, it is possible to improve input and output gain characteristics and reduce output signal distortion.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

The following describes power amplifier circuits according to embodiments of the present disclosure in detail with reference to the drawings. It should be noted that the present disclosure is not limited by the embodiments. Components in the embodiments include those that are replaceable and easily made by a person skilled in the art, or those that are substantially the same. The embodiments are illustrative, and components presented in different embodiments may be partially replaced or combined. Features common to a first embodiment will not be described in a second embodiment and the subsequent embodiments, and only the differences will be described. In particular, similar operations and effects achieved with similar configurations will not be described again in the individual embodiments.

Prior to the description of the embodiments, a comparative example will be described first to help understand the embodiments.

Comparative Example

Figure 1:
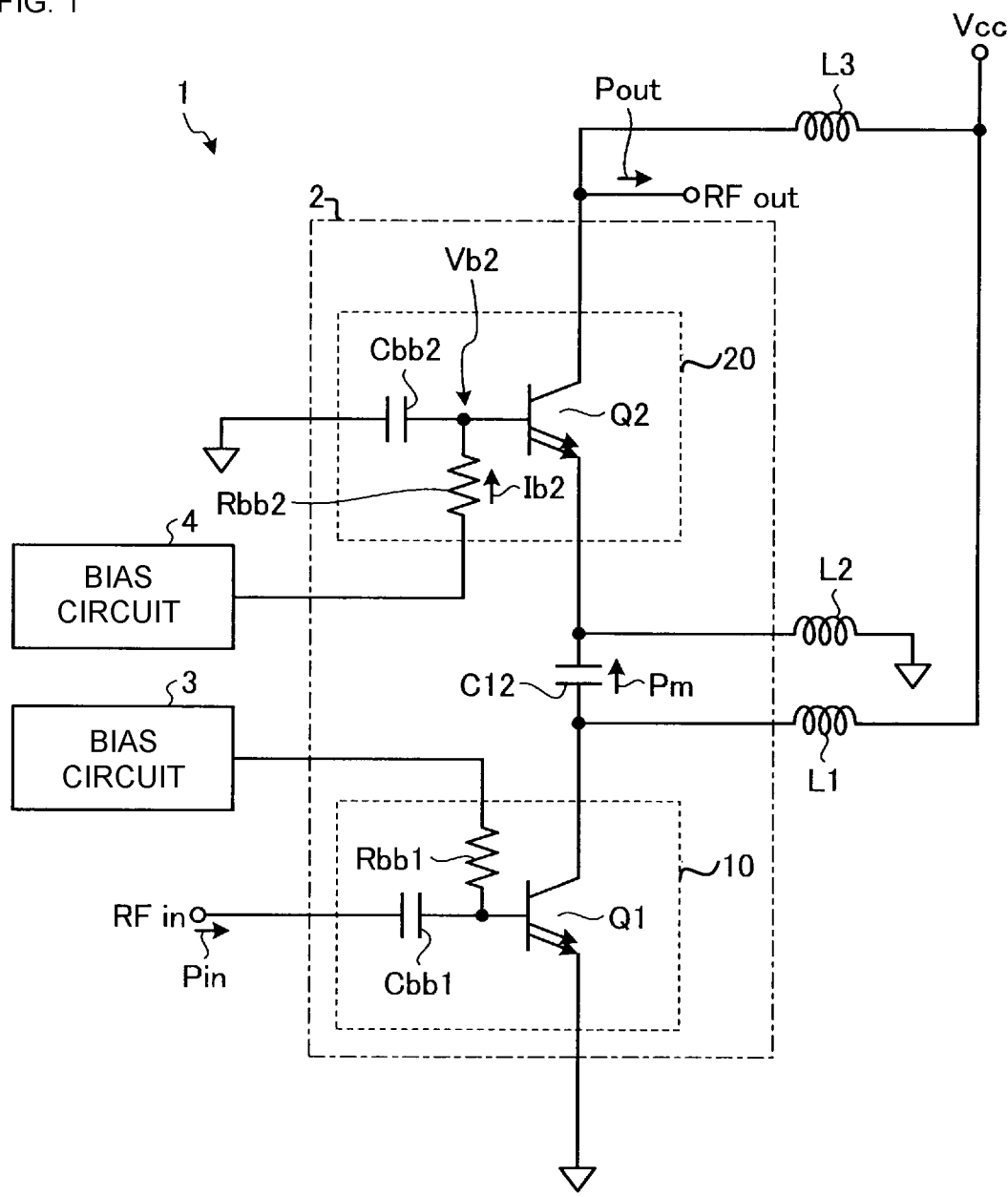
FIG. 1 illustrates the configuration of a power amplifier circuit of a comparative example.

FIG. 1 illustrates the configuration of a power amplifier circuit 1 of a comparative example. The power amplifier circuit 1 illustrated in FIG. 1 includes a power amplifier 2, a first bias circuit 3, a second bias circuit 4, a first inductor L1, a second inductor L2, and a third inductor L3.

The power amplifier circuit 1 is mounted in, for example, a mobile communication device such as a mobile phone device and is configured to amplify a radio-frequency (RF) input signal Pin (hereinafter referred to sometimes as "input signal Pin") received at an input terminal RFin and to output an RF output signal Pout (hereinafter referred to sometimes as "output signal Pout") to an output terminal RFout. The frequency of the RF input signal Pin and the RF output signal Pout is, for example, a frequency in the range of about several hundreds of megahertz (MHz) to several tens of gigahertz (GHz), but the present disclosure is not limited to this example.

The power amplifier 2 may be formed on a semiconductor chip (die), for example, but the present disclosure is not limited to this example. The first inductor L1, the second inductor L2, and the third inductor L3 may be formed on a substrate having the semiconductor chip, for example, but the present disclosure is not limited to this example.

The power amplifier 2 includes a first power amplifier 10, a second power amplifier 20, and a capacitor C12.

The capacitor C12 is electrically connected between the first power amplifier 10 and the second power amplifier 20. The capacitor C12 is a direct current (DC) cut capacitor that blocks direct current (DC) while allowing alternating current (AC) to pass. Specifically, the capacitor C12 isolates the first power amplifier 10 and the second power amplifier 20 from each other for DC and couples the first power amplifier 10 and the second power amplifier 20 to each other for AC.

The first power amplifier 10 amplifies the RF input signal Pin and outputs an amplified RF signal Pm to the capacitor C12. The capacitor C12 allows the RF signal Pm to pass. The second power amplifier 20 amplifies the RF signal Pm passing through the capacitor C12 and outputs the amplified RF output signal Pout.

The first power amplifier 10 includes a transistor Q1, a capacitor Cbb1, and a resistor Rbb1. The emitter of the transistor Q1 is electrically connected to a reference potential. The reference potential is ground potential, for example, but the present disclosure is not limited to this example.

The base of the transistor Q1 is electrically connected to a first end of the capacitor Cbb1. A second end of the capacitor Cbb1 is electrically connected to the input terminal RFin. The input terminal RFin receives the RF input signal Pin. The capacitor Cbb1 is a DC cut capacitor that blocks the DC component of the RF input signal Pin while allowing the AC component of the RF input signal Pin to pass. The input terminal RFin corresponds to an "input section" of the present disclosure.

The base of the transistor Q1 is electrically connected to a first end of the resistor Rbb1. A bias, that is, a bias current or bias voltage, is supplied to a second end of the resistor Rbb1 from the first bias circuit 3. The bias current or bias voltage supplied from the first bias circuit 3 corresponds to a "first bias" of the present disclosure.

The collector of the transistor Q1 is electrically connected to a first end of the first inductor L1. A second end of the first inductor L1 is electrically connected to a power supply potential Vcc. The first inductor L1 is a choke inductor that allows DC to pass while blocking AC and that prevents the coupling of an RF signal to a power supply circuit. The collector of the transistor Q1 is electrically connected to a first end of the capacitor C12.

The power supply potential Vcc corresponds to a "first power supply potential" of the present disclosure. The power supply potential Vcc may be an envelope tracking (ET) power supply, a standard DC power supply, or a variable DC power supply such as a DC-DC converter.

The transistor Q1 corresponds to a "first transistor" of the present disclosure. The capacitor Cbb1 corresponds to a "first capacitor" of the present disclosure. The resistor Rbb1 corresponds to a "first resistor" of the present disclosure.

In summary, in the first power amplifier 10, the power supply potential Vcc is supplied to the collector of the transistor Q1 via the first inductor L1, and the emitter of the transistor Q1 is grounded. A bias current or bias voltage is supplied to the base of the transistor Q1 from the first bias circuit 3, and the base of the transistor Q1 receives the RF input signal Pin. Accordingly, the transistor Q1 amplifies the RF input signal Pin and outputs the amplified RF signal Pm to the second power amplifier 20 via the capacitor C12.

The second power amplifier 20 includes a transistor Q2, a capacitor Cbb2, and a resistor Rbb2. The emitter of the transistor Q2 is electrically connected to a second end of the capacitor C12.

The emitter of the transistor Q2 is also electrically connected to a first end of the second inductor L2. A second end of the second inductor L2 is electrically connected to the reference potential. The second inductor L2 is a choke inductor that allows DC to pass while blocking AC.

The base of the transistor Q2 is electrically connected to a first end of the capacitor Cbb2. A second end of the capacitor Cbb2 is electrically connected to the reference potential. The capacitor Cbb2 blocks DC while allowing AC to pass. The base of the transistor Q2 corresponds to a "base of a second transistor" of the present disclosure.

The base of the transistor Q2 is electrically connected to a first end of the resistor Rbb2. A bias current or bias voltage is supplied to a second end of the resistor Rbb2 from the second bias circuit 4.

The bias current or bias voltage supplied from the second bias circuit 4 corresponds to a "second bias" of the present disclosure.

The collector of the transistor Q2 is electrically connected to a first end of the third inductor L3. A second end of the third inductor L3 is electrically connected to the power supply potential Vcc. The third inductor L3 is a choke inductor that allows DC to pass while blocking AC and that prevents the coupling of an RF signal to a power supply circuit.

A load circuit (not illustrated) is connected to the output terminal RFout. A matching circuit may be disposed between the output terminal RFout and the load circuit.

The transistor Q2 corresponds to a "second transistor" of the present disclosure. The capacitor Cbb2 corresponds to a "second capacitor" of the present disclosure. The resistor Rbb2 corresponds to a "second resistor" of the present disclosure.

In summary, in the second power amplifier 20, the power supply potential Vcc is supplied to the collector of the transistor Q2 via the third inductor L3, and the emitter of the transistor Q2 is grounded via the second inductor L2. Further, the emitter of the transistor Q2 receives the RF signal Pm from the first power amplifier 10 via the capacitor C12. A bias current or bias voltage is supplied to the base of the transistor Q2 from the second bias circuit 4. Accordingly, the transistor Q2 amplifies the RF signal Pm and outputs the amplified RF output signal Pout.

In the present disclosure, each transistor is a bipolar transistor, for example, but the present disclosure is not limited to this example. Non-limiting examples of the bipolar transistor include a heterojunction bipolar transistor (HBT). Each transistor may be, for example, a field effect transistor (FET). In this case, the collector may be read as "drain", the base may be read as "gate", and the emitter may be read as "source".

Each transistor may be a multi-finger transistor having a plurality of unit transistors (also referred to as fingers) electrically connected in parallel with each other. The term "unit transistor" refers to a minimum element of a transistor.

First Embodiment

Figure 2:
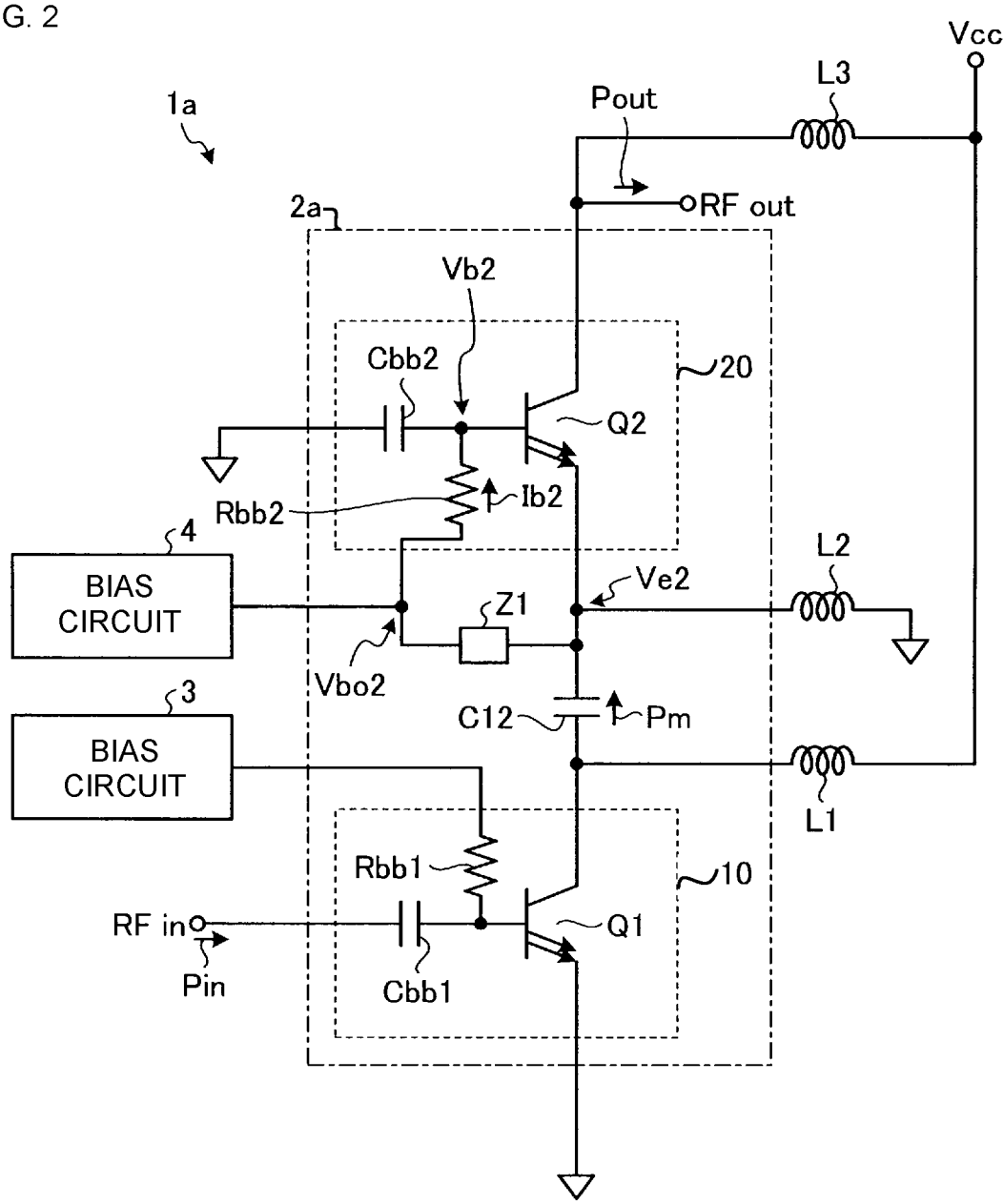
FIG. 2 illustrates the configuration of a power amplifier circuit according to a first embodiment.

FIG. 2 illustrates the configuration of a power amplifier circuit 1a according to a first embodiment. The power amplifier circuit 1a according to the first embodiment illustrated in FIG. 2 includes a power amplifier 2a, a first bias circuit 3, a second bias circuit 4, a first inductor L1, a second inductor L2, and a third inductor L3.

The power amplifier 2a includes a first power amplifier 10, a second power amplifier 20, a capacitor C12, and an impedance circuit Z1. The power amplifier 2a illustrated in FIG. 2 is different from the power amplifier 2 of the comparative example illustrated in FIG. 1 in that the power amplifier 2a includes the impedance circuit Z1.

The impedance circuit Z1 has a first end electrically connected to an output section of the second bias circuit 4. A second end of the impedance circuit Z1 is electrically connected between the emitter of the transistor Q2 and a first end of the capacitor C12. A portion of the RF signal Pm passing through the capacitor C12 is applied to the output section of the second bias circuit 4 via the impedance circuit Z1. Accordingly, a voltage Vbo2 obtained by adding the portion of the RF signal Pm to the output of the second bias circuit 4 is inputted to the second power amplifier 20. In response to the voltage Vbo2 being inputted to the second power amplifier 20, a current Ib2 flows through the resistor Rbb2, and a base voltage Vb2 of the transistor Q2 is set. The "portion of the RF signal Pm" corresponds to a "signal corresponding to a radio-frequency input signal" of the present disclosure.

Figure 3:
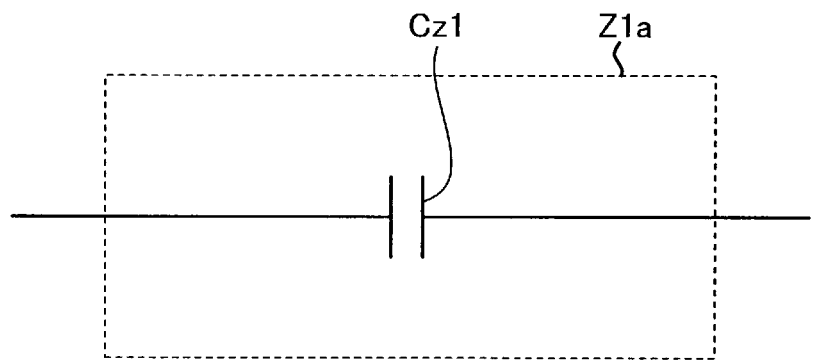
FIG. 3 illustrates an example configuration of an impedance circuit illustrated in FIG. 2.
Figure 4:
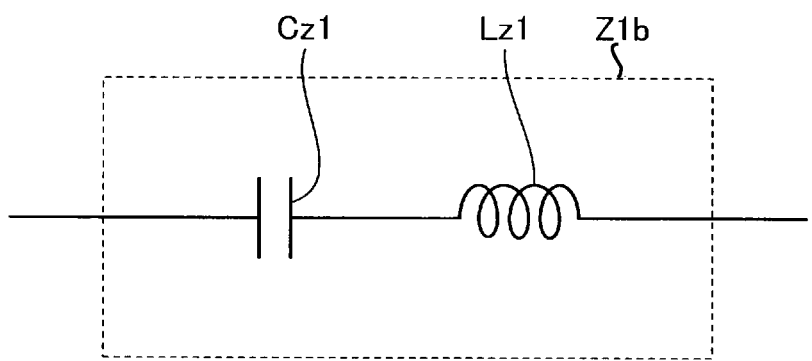
FIG. 4 illustrates an example configuration of the impedance circuit illustrated in FIG. 2.

The impedance circuit Z1 is implemented using a circuit that is open for DC and conducting for AC, for example. FIGS. 3 and 4 illustrate example configurations of the impedance circuit Z1 illustrated in FIG. 2. In FIG. 3, an impedance circuit Z1a is formed of a capacitor Cz1. Accordingly, the impedance circuit Z1a is a circuit that is open for DC and conducting for AC. With the use of the impedance circuit Z1a as the impedance circuit Z1 illustrated in FIG. 2, the capacitor Cz1 is connected in series between the output section of the second bias circuit 4 and the emitter of the transistor Q2.

In FIG. 4, an impedance circuit Z1b is formed of a series circuit of a capacitor Cz1 and an inductor Lz1. Accordingly, the impedance circuit Z1b is a circuit that is open for DC and conducting for AC. With the use of the impedance circuit Z1b as the impedance circuit Z1 illustrated in FIG. 2, the capacitor Cz1 and the inductor Lz1 are connected in series between the output section of the second bias circuit 4 and the emitter of the transistor Q2.

Bias Circuit

Figure 5:
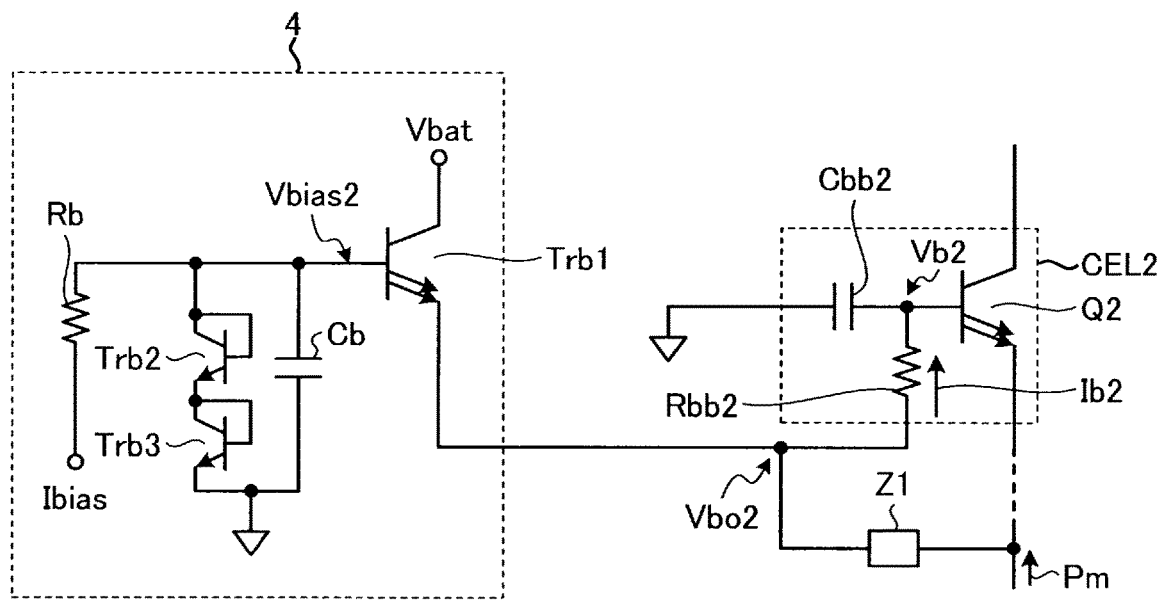
FIG. 5 illustrates an example configuration of a second bias circuit according to the first embodiment illustrated in FIG. 2.

An example configuration of a bias circuit will now be described. FIG. 5 illustrates an example configuration of the second bias circuit 4 according to the first embodiment, which has been described with reference to FIG. 2. In FIG. 5, the second bias circuit 4 includes transistors Trb1, Trb2, and Trb3, a capacitor Cb, and a resistor Rb.

A power supply voltage Vbat is applied to the collector of the transistor Trb1. A bias current Ibias is applied to the base of the transistor Trb1 via the resistor Rb. The transistor Trb2 is connected to the base of the transistor Trb1. The emitter of the transistor Trb2 is connected to the collector of the transistor Trb3, and the emitter of the transistor Trb3 is connected to a reference potential. The base and collector of each of the transistors Trb2 and Trb3 are connected. The capacitor Cb is connected in parallel with the transistors Trb2 and Trb3. Accordingly, a base voltage Vbias2 of the transistor Trb1 in the output stage of the second bias circuit 4 is kept at a constant value. The transistor Trb2 and the transistor Trb3 may be replaced with diodes.

In the configuration described above, a voltage corresponding to the base voltage Vbias2 of the transistor Trb1 is outputted from the second bias circuit 4 and is applied to a cell CEL2 as the voltage Vbo2. The cell CEL2 has the function of the second power amplifier 20 illustrated in FIG. 2. As described above, a portion of the RF signal Pm is applied to the output section of the second bias circuit 4 via the impedance circuit Z1.

In response to an AC signal being inputted via the impedance circuit Z1, the voltage Vbo2, which is the potential on the emitter of the transistor Trb1 in the output stage of the second bias circuit 4, fluctuates, and the transistor Trb1 performs a detection operation, thereby increasing the average value of the voltage Vbo2. Thus, the effect of suppressing the reduction in the base voltage Vb2 of the transistor Q2 during a large-signal operation can be enhanced.

Figure 6:
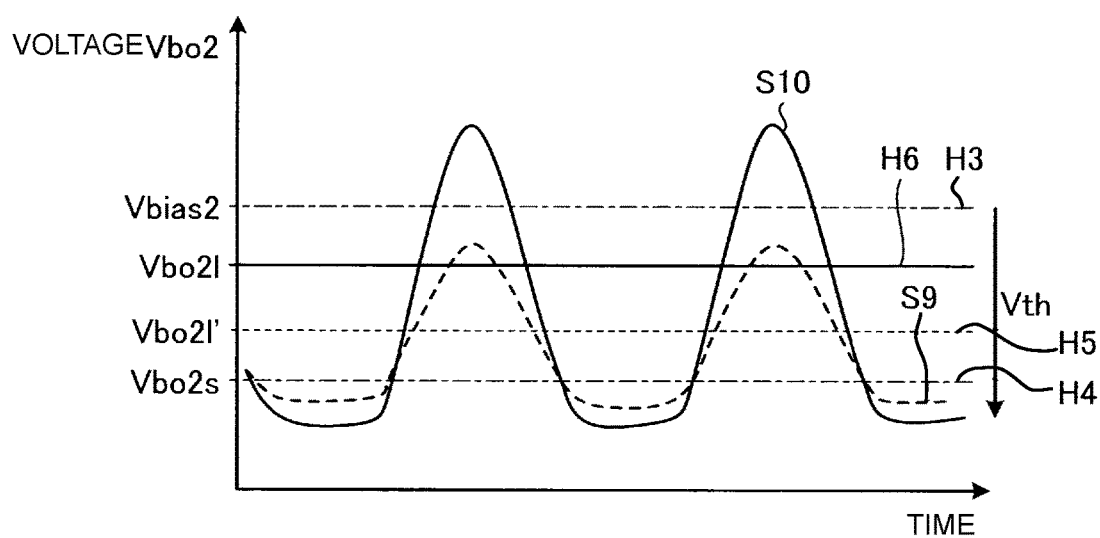
FIG. 6 illustrates a change in the potential on the emitter of a transistor in the output stage of the second bias circuit during a large-signal operation.

FIG. 6 illustrates a change in the potential on the emitter of the transistor Trb1 in the output stage of the second bias circuit 4 during a large-signal operation. In FIG. 6, a one-dot chain line H3 indicates the base voltage Vbias2 of the transistor Trb1 of the second bias circuit 4. A one-dot chain line H4 indicates an average value Vbo2s of the emitter potential of the transistor Trb1 of the second bias circuit 4 when the input signal Pin is not inputted or when the input signal Pin has a low level. A broken line H5 indicates an average value Vbo2l' of the emitter potential of the transistor Trb1 of the second bias circuit 4 during a large-signal operation in the comparative example illustrated in FIG. 1. A solid line H6 indicates an average value Vbo2l of the emitter potential of the transistor Trb1 of the second bias circuit 4 during a large-signal operation in the configuration of the first embodiment illustrated in FIG. 2.

As illustrated in FIG. 6, the base voltage Vbias2 of the transistor Trb1 in the output stage of the second bias circuit 4 is kept at a constant value. During a large-signal operation in which the level of the input signal Pin is high, the lower limit of the voltage Vbo2 is clipped at a predetermined voltage (obtained by subtracting a threshold voltage Vth from the base voltage Vbias2). While the average value Vbo2s of the emitter potential of the transistor Trb1 is obtained when the input signal Pin is not inputted or when the input signal Pin has a low level, in the comparative example, the voltage Vbo2 changes in a manner indicated by a broken line S9 during a large-signal operation, and the average value of the voltage Vbo2 is equal to the voltage Vbo2l'. In the configuration according to this embodiment, in contrast, the voltage Vbo2 changes in a manner indicated by a solid line S10 during a large-signal operation, and the average value of the voltage Vbo2 is equal to the voltage Vbo2l which is higher than the voltage Vbo2l'. Accordingly, the reduction in the base voltage Vb2 of the transistor Q2 during a large-signal operation is suppressed.

The operation of the power amplifier circuit 1a illustrated in FIG. 2 will be described in comparison with the operation of the power amplifier circuit 1 illustrated in FIG. 1. FIGS. 7 to 10 illustrate the operations of the power amplifier circuit 1 illustrated in FIG. 1 and the power amplifier circuit 1a illustrated in FIG. 2.

Figure 7:
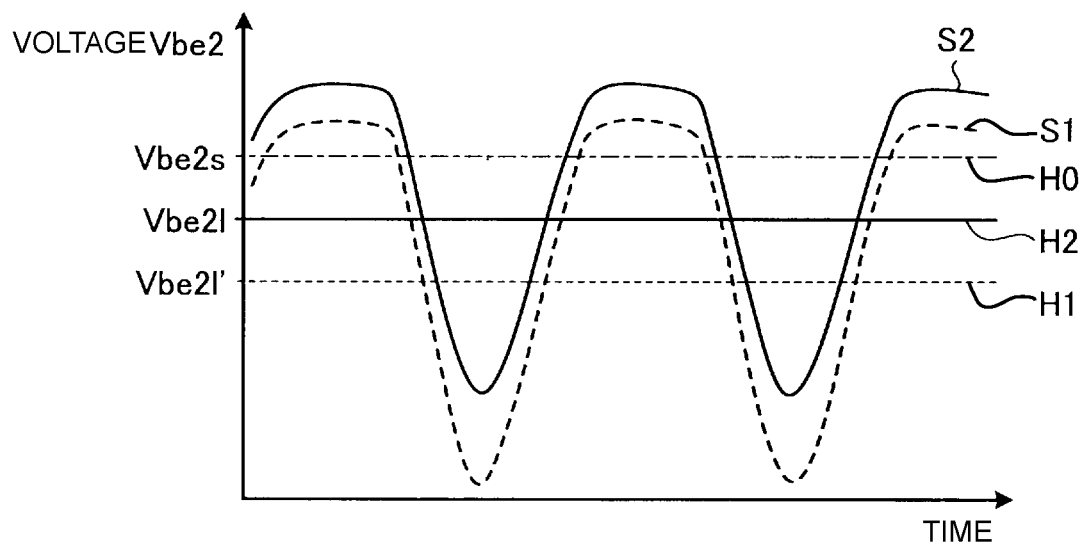
FIG. 7 illustrates the operation of the power amplifier circuit illustrated in FIG. 1 and the power amplifier circuit illustrated in FIG. 2.

FIG. 7 illustrates changes in the base-emitter voltage of the transistor Q2. In FIG. 7, a broken line S1 indicates a base-emitter voltage Vbe2 of the transistor Q2 in the comparative example. A solid line S2 indicates a base-emitter voltage Vbe2 of the transistor Q2 in the configuration according to this embodiment illustrated in FIG. 2. The base-emitter voltage Vbe2 is a value obtained by subtracting an emitter voltage Ve2 from the base voltage Vb2.

A base bias voltage Vbe2s indicated by a one-dot chain line H0 is the average value of the base voltage when the input signal Pin is not inputted or when the input signal Pin has a low level in the comparative example illustrated in FIG. 1 and the configuration according to this embodiment illustrated in FIG. 2. A voltage Vbe2l' indicated by a broken line H1 is the average value of the base voltage Vb2 when the input signal Pin has a high level in the comparative example illustrated in FIG. 1. A voltage Vbe2l indicated by a solid line H2 is the average value of the base voltage Vb2 when the input signal Pin has a high level in the configuration according to this embodiment illustrated in FIG. 2.

In both the configuration of the comparative example illustrated in FIG. 1 and the configuration according to this embodiment illustrated in FIG. 2, when the input signal Pin has a low level, the base-emitter voltage Vbe2 has a near-sinusoidal waveform, and the average value of the base voltage is equal to the base bias voltage Vbe2s. When the input signal Pin has a high level, in contrast, in the configuration of the comparative example illustrated in FIG. 1, a region higher than the base bias voltage Vbe2s is clipped by the limitation of the current Ib2, and the average value of the base voltage is reduced to the voltage Vbe2l'. In the configuration according to this embodiment illustrated in FIG. 2, in contrast, the base voltage Vb2 of the transistor Q2 increases with the increase in the voltage Vbo2 inputted from the second bias circuit 4, causing an increase in the waveform of the base-emitter voltage Vbe2. The average value of the base voltage is equal to the voltage Vbe2l. Accordingly, in the configuration according to this embodiment illustrated in FIG. 2, the reduction in the base-emitter voltage Vbe2 is suppressed compared with the configuration of the comparative example. Since the emitter of the transistor Q2 is grounded for DC, the level of the suppression of the reduction in the base-emitter voltage Vbe2 is regarded as being substantially the same as that of the suppression of the reduction in the base voltage Vb2. That is, in this embodiment, to address the resistor Rbb2, which causes a voltage drop across the base of the transistor Q2, a portion of the AC signal is applied to the output section of the second bias circuit 4 via the impedance circuit Z1. This increases the voltage Vbo2 to be applied to the resistor Rbb2, thereby suppressing the reduction in the base voltage Vb2 of the transistor Q2 during a large-signal operation.

Figure 8:
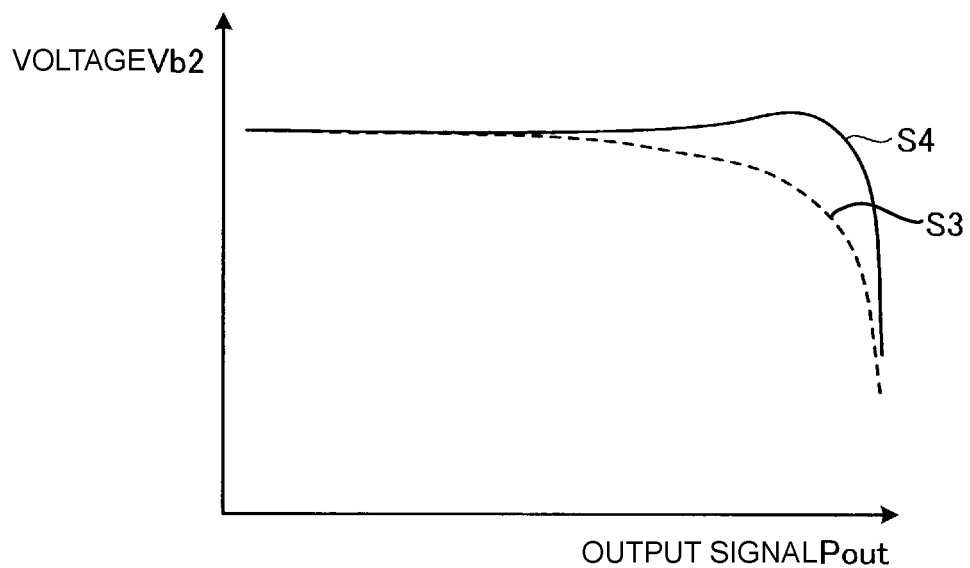
FIG. 8 illustrates the operation of the power amplifier circuit illustrated in FIG. 1 and the power amplifier circuit illustrated in FIG. 2.

FIG. 8 is a conceptual diagram illustrating the relationship between the output signal Pout and the base voltage Vb2 of the transistor Q2. In FIG. 8, a broken line S3 indicates the base voltage Vb2 of the transistor Q2 in the comparative example. A solid line S4 indicates an example of the base voltage Vb2 of the transistor Q2 in the configuration according to this embodiment illustrated in FIG. 2. As illustrated in FIG. 8, in the comparative example, as indicated by the broken line S3, the base voltage Vb2 is gradually decreased as the output signal Pout increases, and is then rapidly decreased. In the configuration according to this embodiment, in contrast, as indicated by the solid line S4, the base voltage Vb2 is gradually increased as the output signal Pout increases, and is then rapidly decreased. The base voltage Vb2 is not gradually decreased.

Figure 9:
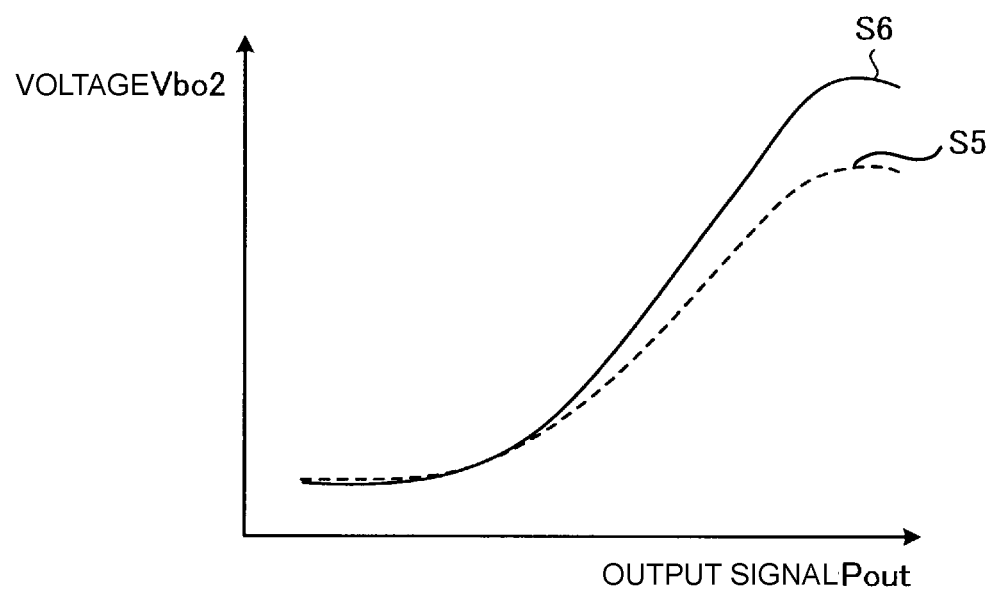
FIG. 9 illustrates the operation of the power amplifier circuit illustrated in FIG. 1 and the power amplifier circuit illustrated in FIG. 2.

FIG. 9 is a conceptual diagram illustrating the relationship between the output signal Pout and the voltage Vbo2 inputted from the second bias circuit 4. In FIG. 9, a broken line S5 indicates the voltage Vbo2 in the comparative example. A solid line S6 indicates an example of the voltage Vbo2 in the configuration according to this embodiment. As illustrated in FIG. 9, in a region where the level of the output signal Pout is low, the voltage Vbo2 indicated by the broken line S5 and the voltage Vbo2 indicated by the solid line S6 are approximately equal. In a region where the level of the output signal Pout is high, in contrast, the voltage Vbo2 in the configuration according to this embodiment indicated by the solid line S6 is higher than the voltage Vbo2 in the comparative example indicated by the broken line S5. This is because a portion of the RF signal Pm is applied to the output section of the second bias circuit 4 via the impedance circuit Z1.

Figure 10:
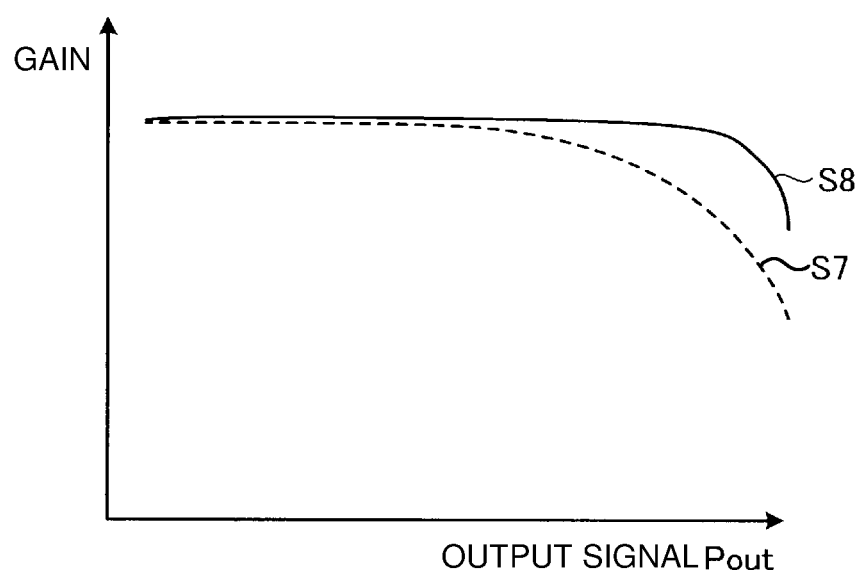
FIG. 10 illustrates the operation of the power amplifier circuit illustrated in FIG. 1 and the power amplifier circuit illustrated in FIG. 2.

FIG. 10 is a conceptual diagram illustrating the relationship between the output signal Pout and gain. In FIG. 10, a broken line S7 indicates gain in the comparative example. A solid line S8 indicates an example of gain in the configuration according to this embodiment. As illustrated in FIG. 10, in the comparative example indicated by the broken line S7, gain is decreased as the output signal Pout increases. In the configuration according to this embodiment indicated by the solid line S8, in contrast, the reduction in the gain can be suppressed even during a large-signal operation in which the output signal Pout is relatively large. Accordingly, the transistor Q2 is kept in the on state, the input and output gain characteristics are improved, and the output signal distortion can be reduced.

Second Embodiment

In the power amplifier circuit $1a$ illustrated in FIG. 2, the first power amplifier 10 may include parallel-connected cells, and each cell may include the transistor Q1. Further, the second power amplifier 20 may include parallel-connected cells, and each cell may include the transistor Q2. The following describes parallel-connected cells each including the transistor Q1 or Q2.

Figure 11:
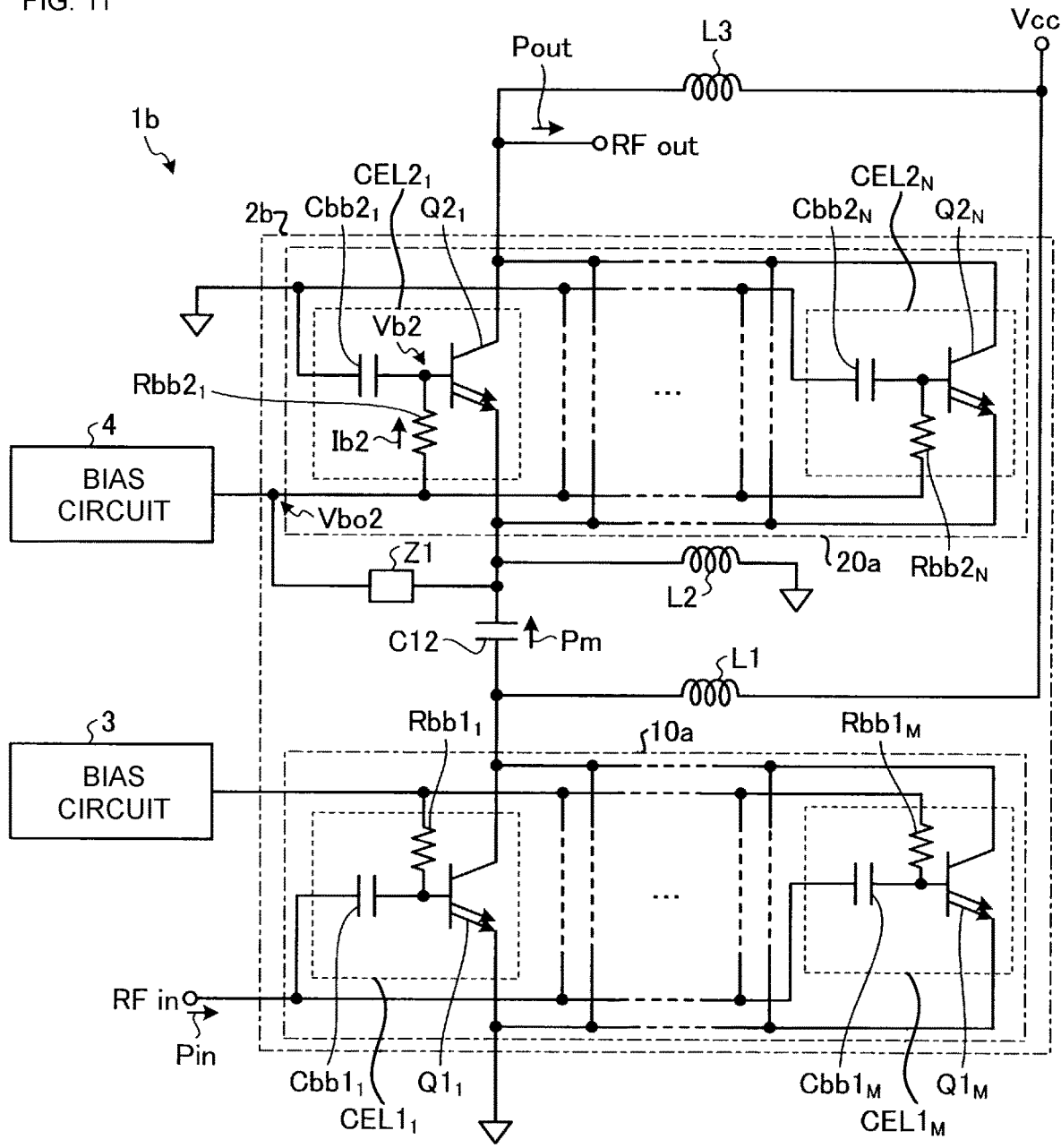
FIG. 11 illustrates the configuration of a power amplifier circuit according to a second embodiment.

FIG. 11 illustrates the configuration of a power amplifier circuit $1b$ according to a second embodiment. In FIG. 11, unlike the power amplifier circuit $1a$, the power amplifier circuit $1b$ includes a power amplifier $2b$ in place of the power amplifier $2a$. Unlike the power amplifier $2a$, the power amplifier $2b$ includes a first power amplifier $10a$ and a second power amplifier $20a$ in place of the first power amplifier 10 and the second power amplifier 20.

In FIG. 11, the first power amplifier $10a$ includes M parallel-connected cells $CEL1_1, \ldots,$ and $CEL1_M$ (M is a natural number). The cells $CEL1_1, \ldots,$ and $CEL1_M$ include transistors $Q1_1, \ldots,$ and $Q1_M$, respectively. The cells $CEL1_1, \ldots,$ and $CEL1_M$ include capacitors $Cbb1_1, \ldots,$ and $Cbb1_M$, respectively. The cells $CEL1_1, \ldots,$ and $CEL1_M$ include resistors $Rbb1_1, \ldots,$ and $Rbb1_M$, respectively. The term "cell", as used herein, is defined as a component including a transistor, a capacitor, and a resistor that are connected to one another. The first power amplifier $10a$ may include a plurality of (i.e., M≥2) parallel-connected cells, or may include a single cell (i.e., M=1).

The emitters of the transistors $Q1_1, \ldots,$ and $Q1_M$ are electrically connected to a reference potential. The reference potential is ground potential, for example, but the present disclosure is not limited to this example.

The bases of the transistors $Q1_1, \ldots,$ and $Q1_M$ are electrically connected to first ends of the capacitors $Cbb1_1, \ldots,$ and $Cbb1_M$, respectively. Second ends of the capacitors $Cbb1_1, \ldots,$ and $Cbb1_M$ are electrically connected to the input terminal RFin. The input terminal RFin receives the RF input signal Pin. Each of the capacitors $Cbb1_1, \ldots,$ and $Cbb1_M$ is a DC cut capacitor that blocks the DC component of the RF input signal Pin while allowing the AC component of the RF input signal Pin to pass.

The bases of the transistors $Q1_1, \ldots,$ and $Q1_M$ are electrically connected to first ends of the resistors $Rbb1_1, \ldots,$ and $Rbb1_M$, respectively. A bias, that is, a bias current or bias voltage, is inputted to second ends of the resistors $Rbb1_1, \ldots,$ and $Rbb1_M$ from the first bias circuit 3.

The bias current or bias voltage inputted from the first bias circuit 3 corresponds to a "first bias" of the present disclosure.

The collectors of the transistors $Q1_1, \ldots,$ and $Q1_M$ are electrically connected to a first end of the first inductor L1. A second end of the first inductor L1 is electrically connected to the power supply potential Vcc. The first inductor L1 is a choke inductor that allows DC to pass while blocking AC and that prevents the coupling of an RF signal to a power supply circuit.

The collectors of the transistors $Q1_1, \ldots,$ and $Q1_M$ are electrically connected to a first end of the capacitor C12.

The cells $CEL1_1, \ldots,$ and $CEL1_M$ correspond to a "first cell" of the present disclosure. In the following, the cells $CEL1_1, \ldots,$ and $CEL1_M$ are collectively referred to sometimes as "cells CEL1". The transistors $Q1_1, \ldots,$ and $Q1_M$ correspond to a "first transistor" of the present disclosure. In the following, the transistors $Q1_1, \ldots,$ and $Q1_M$ are collectively referred to sometimes as "transistors Q1". The capacitors $Cbb1_1, \ldots,$ and $Cbb1_M$ correspond to a "first capacitor" of the present disclosure. In the following, the capacitors $Cbb1_1, \ldots,$ and $Cbb1_M$ are collectively referred to sometimes as "capacitors Cbb1". The resistors $Rbb1_1, \ldots,$ and $Rbb1_M$ correspond to a "first resistor" of the present disclosure. In the following, the resistors $Rbb1_1, \ldots,$ and $Rbb1_M$ are collectively referred to sometimes as "resistors Rbb1".

In summary, in the first power amplifier $10a$, the power supply potential Vcc is supplied to the collectors of the transistors Q1 via the first inductor L1, and the emitters of the transistors Q1 are grounded. Further, a bias current or bias voltage is supplied to the bases of the transistors Q1 from the first bias circuit 3, and the bases of the transistors Q1 receive the RF input signal Pin. Accordingly, each of the transistors Q1 amplifies the RF input signal Pin and outputs the amplified RF signal Pm to the second power amplifier $20a$ via the capacitor C12.

The second power amplifier $20a$ includes N parallel-connected cells $CEL2_1, \ldots,$ and $CEL2_N$ (N is a natural number). The second power amplifier $20a$ may include a plurality of (i.e., N≥2) parallel-connected cells, or may include a single cell (i.e., N=1).

The number N of cells $CEL2_1, \ldots,$ and $CEL2_N$ may or may not be equal to the number M of cells $CEL1_1, \ldots,$ and $CEL1_M$.

The cells $CEL2_1, \ldots,$ and $CEL2_N$ include transistors $Q2_1, \ldots,$ and $Q2_N$, respectively. The cells $CEL2_1, \ldots,$ and $CEL2_N$ include capacitors $Cbb2_1, \ldots,$ and $Cbb2_N$, respectively. The cells $CEL2_1, \ldots,$ and $CEL2_N$ include resistors $Rbb2_1, \ldots,$ and $Rbb2_N$, respectively.

The emitters of the transistors $Q2_1, \ldots,$ and $Q2_N$ are electrically connected to a second end of the capacitor C12.

The emitters of the transistors $Q2_1, \ldots,$ and $Q2_N$ are electrically connected to a first end of the second inductor L2. A second end of the second inductor L2 is electrically connected to the reference potential. The second inductor L2 is a choke inductor that allows DC to pass while blocking AC.

The bases of the transistors $Q2_1, \ldots,$ and $Q2_N$ are electrically connected to first ends of the capacitors $Cbb2_1, \ldots,$ and $Cbb2_N$, respectively. Second ends of the capacitors $Cbb2_1, \ldots,$ and $Cbb2_N$ are electrically connected to the reference potential. Each of the capacitors $Cbb2_1, \ldots,$ and $Cbb2_N$ blocks DC while allowing AC to pass.

The bases of the transistors $Q2_1, \ldots,$ and $Q2_N$ are electrically connected to first ends of the resistors $Rbb2_1, \ldots,$ and $Rbb2_N$, respectively. A bias current or bias voltage is inputted to second ends of the resistors $Rbb2_1, \ldots,$ and $Rbb2_N$ from the second bias circuit 4.

The bias current or bias voltage inputted from the second bias circuit 4 corresponds to a "second bias" of the present disclosure.

The collectors of the transistors $Q2_1, \ldots,$ and $Q2_N$ are electrically connected to a first end of the third inductor L3. A second end of the third inductor L3 is electrically connected to the power supply potential Vcc. The third inductor L3 is a choke inductor that allows DC to pass while blocking AC and that prevents the coupling of an RF signal to a power supply circuit.

The cells $CEL2_1, \ldots,$ and $CEL2_N$ correspond to a "second cell" of the present disclosure. In the following, the cells $CEL2_1, \ldots,$ and $CEL2_N$ are collectively referred to sometimes as "cells CEL2". The transistors $Q2_1, \ldots,$ and $Q2_N$ correspond to a "second transistor" of the present disclosure. In the following, the transistors $Q2_1, \ldots,$ and $Q2_N$ are collectively referred to sometimes as "transistors Q2". The capacitors $Cbb2_1, \ldots,$ and $Cbb2_N$ correspond to a "second capacitor" of the present disclosure. In the following, the capacitors $Cbb2_1, \ldots,$ and $Cbb2_N$ are collectively referred to sometimes as "capacitors Cbb2". The resistors $Rbb2_1, \ldots,$ and $Rbb2_N$ correspond to a "second resistor" of the present disclosure. In the following, the resistors $Rbb2_1, \ldots,$ and $Rbb2_N$ are collectively referred to sometimes as "resistors Rbb2".

In summary, in the second power amplifier 20a, the power supply potential Vcc is supplied to the collectors of the transistors Q2 via the third inductor L3, and the emitters of the transistors Q2 are grounded via the second inductor L2. Further, the emitters of the transistors Q2 receive the RF signal Pm from the first power amplifier 10a via the capacitor C12. Further, a bias current or bias voltage is supplied to the bases of the transistors Q2 from the second bias circuit 4. Accordingly, each of the transistors Q2 amplifies the RF signal Pm and outputs the amplified RF output signal Pout.

Unlike the power amplifier 2 of the comparative example illustrated in FIG. 1, the power amplifier 2b includes an impedance circuit Z1. A portion of the RF signal Pm passing through the capacitor C12 is applied to an output section of the second bias circuit 4 via the impedance circuit Z1. Accordingly, a voltage Vbo2 obtained by adding the portion of the RF signal Pm to the output of the second bias circuit 4 is inputted to the second power amplifier 20a. In response to the voltage Vbo2 being inputted to the second power amplifier 20a, a current Ib2 flows through the resistors Rbb2, and the base voltage Vb2 of the transistors Q2 is set. The "portion of the RF signal Pm" corresponds to a "signal corresponding to a radio-frequency input signal" of the present disclosure. The impedance circuit Z1 is a circuit that is open for DC and conducting for AC. For example, the impedance circuit Z1 has any of the configurations described with reference to FIGS. 3 and 4.

Figure 12:
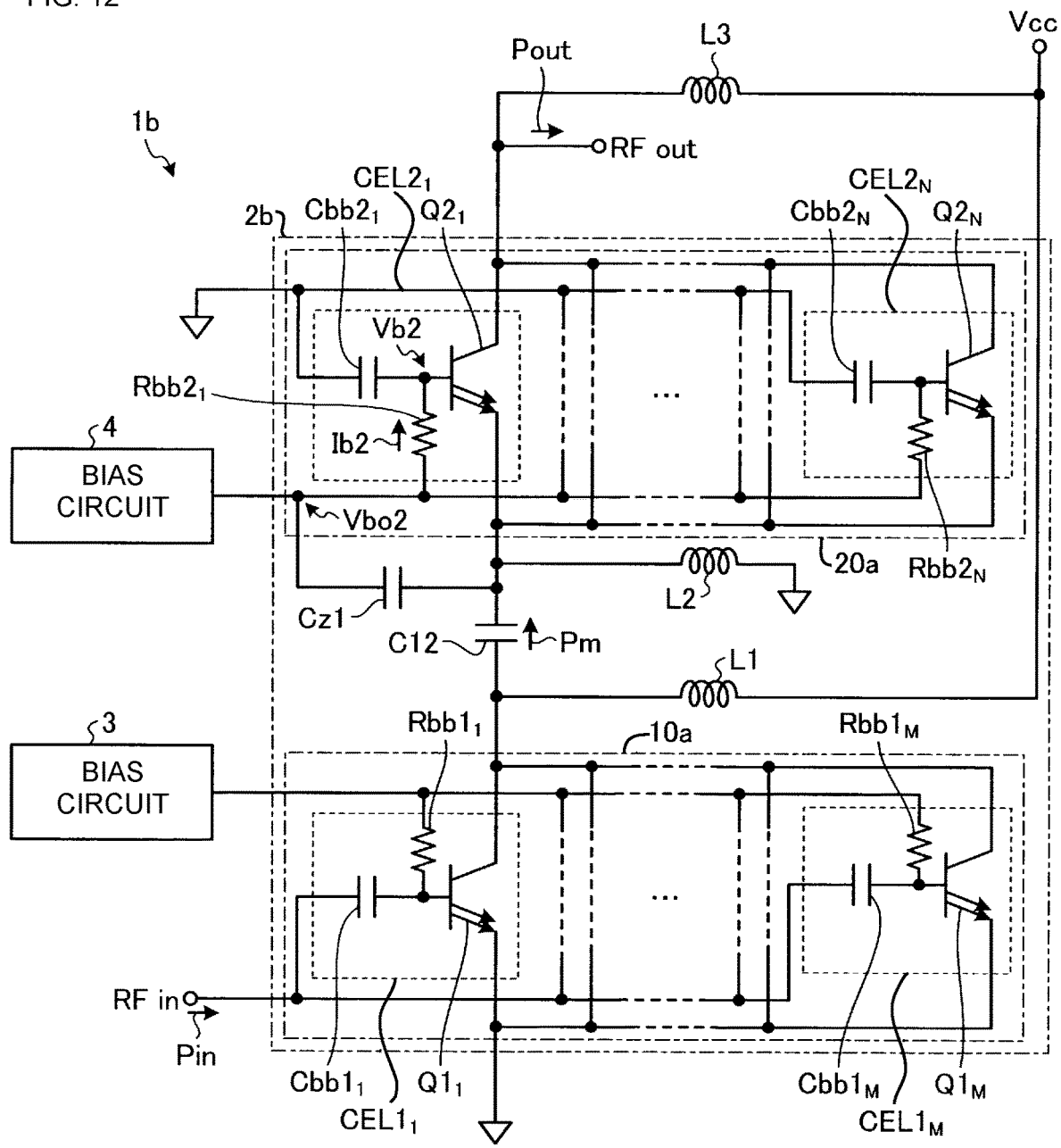
FIG. 12 illustrates an example configuration of a power amplifier circuit in which the power amplifier illustrated in FIG. 11 includes the impedance circuit illustrated in FIG. 3.

FIG. 12 illustrates an example configuration of the power amplifier circuit 1b in which the power amplifier 2b of FIG. 11 includes the impedance circuit Z1a illustrated in FIG. 3. In FIG. 12, the power amplifier circuit 1b includes the power amplifier 2b. The power amplifier 2b includes the capacitor Cz1, which serves as an impedance circuit.

Accordingly, as in the first embodiment described above, the reduction in the base voltage of the transistors Q2 can be suppressed even during a large-signal operation, the transistors Q2 are kept in the on state, the input and output gain characteristics are improved, and the output signal distortion can be reduced.

Third Embodiment

Figure 13:
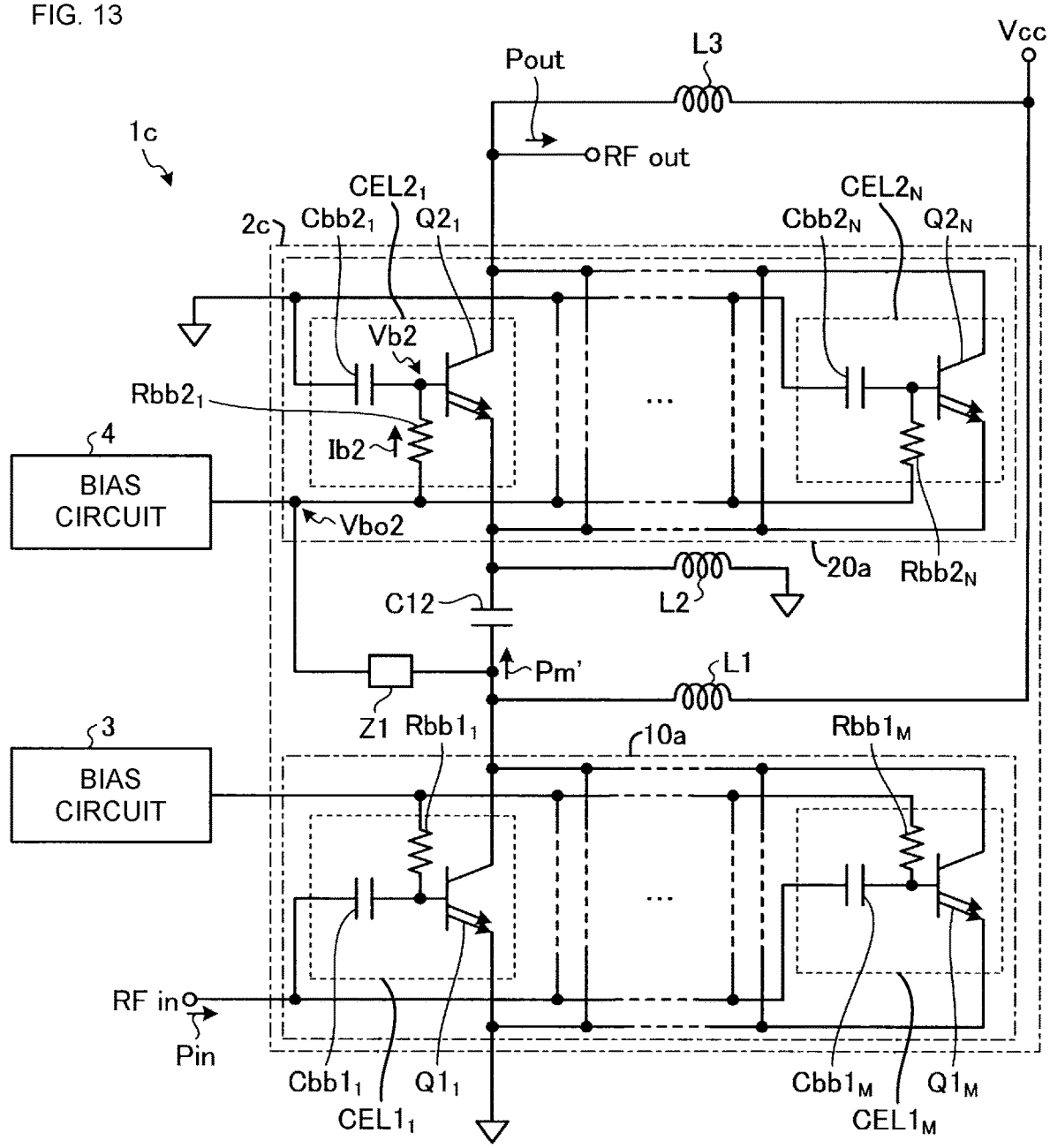
FIG. 13 illustrates the configuration of a power amplifier circuit according to a third embodiment.

FIG. 13 illustrates the configuration of a power amplifier circuit 1c according to a third embodiment. In FIG. 13, unlike the power amplifier circuit 1b, the power amplifier circuit 1c includes a power amplifier 2c in place of the power amplifier 2b. In the power amplifier 2c, the second end of the impedance circuit Z1 is connected to a node different from the one in the power amplifier 2b.

In FIG. 13, the first end of the impedance circuit Z1 is electrically connected to the output section of the second bias circuit 4. The second end of the impedance circuit Z1 is connected between the first end of the capacitor C12 and the collectors of the transistors Q1, unlike the power amplifier 2b.

A portion of an RF signal Pm' before passing through the capacitor C12 is applied to the output section of the second bias circuit 4 via the impedance circuit Z1. Accordingly, a voltage Vbo2 obtained by adding the portion of the RF signal Pm' to the output of the impedance circuit Z1 is inputted to the second power amplifier 20a. In response to the voltage Vbo2 being inputted to the second power amplifier 20a, a current Ib2 flows through the resistors Rbb2, and the base voltage Vb2 of the transistors Q2 is set. The "portion of the RF signal Pm'" corresponds to a "signal corresponding to a radio-frequency input signal" of the present disclosure.

The impedance circuit Z1 is a circuit that is open for DC and conducting for AC. For example, the impedance circuit Z1 has any of the configurations described with reference to FIGS. 3 and 4.

Figure 14:
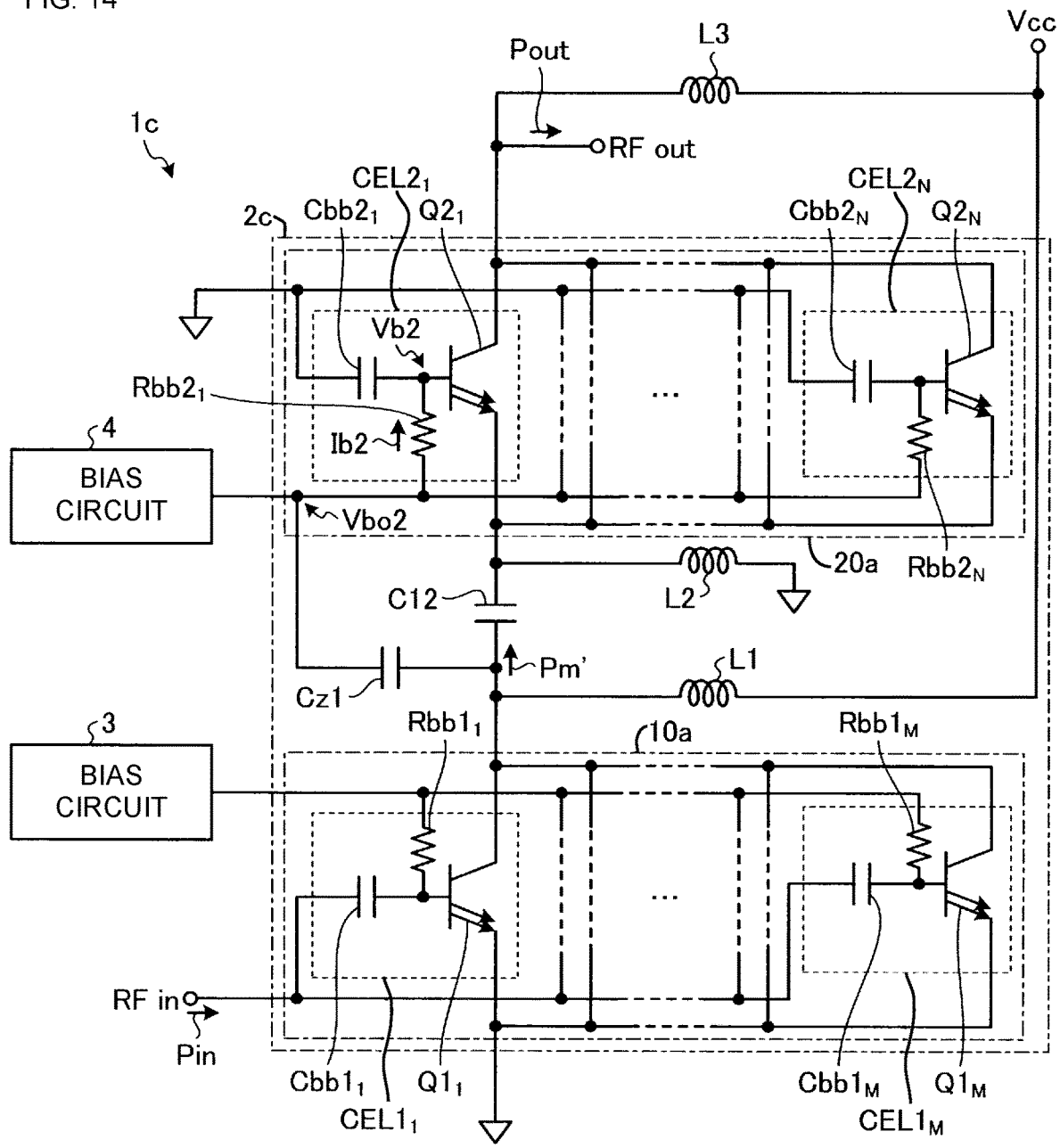
FIG. 14 illustrates an example configuration of the power amplifier illustrated in FIG. 13 that includes the impedance circuit illustrated in FIG. 3.

FIG. 14 illustrates an example configuration of the power amplifier 2c illustrated in FIG. 13 that includes the impedance circuit Z1a illustrated in FIG. 3. In FIG. 14, the power amplifier 2c includes the capacitor Cz1, which serves as an impedance circuit.

Accordingly, as in the first embodiment described above, the reduction in base voltage can be suppressed even during a large-signal operation, the transistors Q2 are kept in the on state, the input and output gain characteristics are improved, and the output signal distortion can be reduced.

Fourth Embodiment

Figure 15:
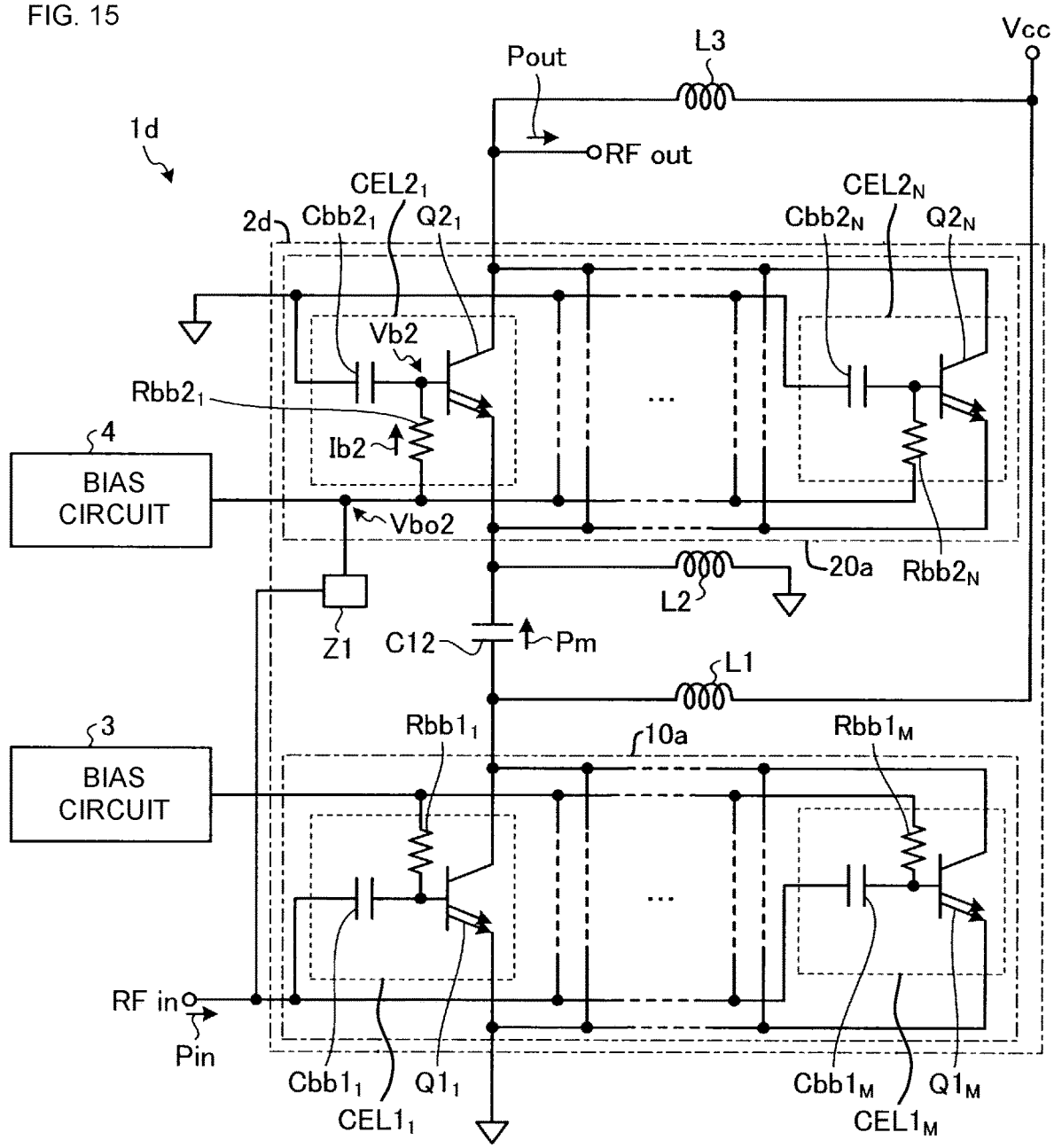
FIG. 15 illustrates the configuration of a power amplifier circuit according to a fourth embodiment.

FIG. 15 illustrates the configuration of a power amplifier circuit 1d according to a fourth embodiment. In FIG. 15, unlike the power amplifier circuit 1b, the power amplifier circuit 1d includes a power amplifier 2d in place of the power amplifier 2b. In the power amplifier 2d, the second end of the impedance circuit Z1 is connected to a node different from the one in the power amplifier 2b.

In FIG. 15, the first end of the impedance circuit Z1 is electrically connected to the output section of the second bias circuit 4. The second end of the impedance circuit Z1 is connected to the input terminal RFin.

A portion of the input signal Pin inputted to the input terminal RFin is applied to the output section of the second bias circuit 4 via the impedance circuit Z1. Accordingly, a voltage Vbo2 obtained by adding the portion of the input signal Pin to the output of the impedance circuit Z1 is inputted to the second power amplifier 20a. In response to the voltage Vbo2 being inputted to the second power amplifier 20a, a current Ib2 flows through the resistors Rbb2, and the base voltage Vb2 of the transistors Q2 is set. The "portion of the input signal Pin" corresponds to a "signal corresponding to a radio-frequency input signal" of the present disclosure.

The impedance circuit Z1 is a circuit that is open for DC and conducting for AC. For example, the impedance circuit Z1 has any of the configurations described with reference to FIGS. 3 and 4.

As described above, in the first to third embodiments, a portion of the RF signal Pm or Pm' is applied to the output section of the second bias circuit 4 via the impedance circuit Z1. The RF signals Pm and Pm' are each a signal inversely amplified by the transistor or transistors Q1. The inversely amplified signal is detected by the second bias circuit 4 and is then applied to the base or bases of the transistor or transistors Q2 via the resistor or resistors Rbb2. The waveform applied at this time includes the detected signal described above, and a signal passing through the base-emitter capacitance of the transistor or transistors Q2. This signal corresponds to the signal indicated by the broken line S9 in FIG. 6. The detected signal and the signal indicated by the broken line S9 in FIG. 6 are in phase, and their voltage levels are strengthened. As a result, the waveform indicated by the solid line S10 in FIG. 6 can be obtained, and therefore the reduction in the base voltage Vb2 of the transistors Q2 can be suppressed.

In contrast, the fourth embodiment uses the input signal Pin that has not been inversely amplified by the transistors Q1. In the fourth embodiment, the signal to be detected by the second bias circuit 4 is a signal obtained before inverse amplification. This signal and the signal passing through the base-emitter capacitance of the transistors Q2 are in opposite phases.

Figure 16:
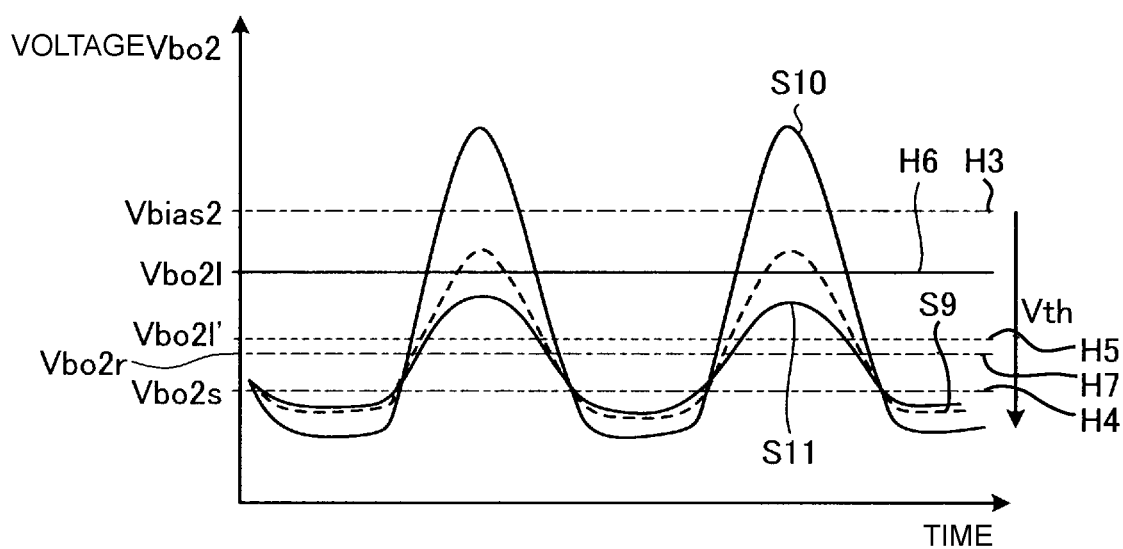
FIG. 16 illustrates an example of a change in the potential on the emitter of the transistor in the output stage of the second bias circuit.

FIG. 16 illustrates an example of a change in the potential on the emitter of the transistor Trb1 in the output stage of the second bias circuit 4. As described above, the signal to be detected by the second bias circuit 4 and the signal passing through the base-emitter capacitance of the transistors Q2 are in opposite phases. Accordingly, as indicated by a solid line S11 in FIG. 16, the voltage Vbo2 is a signal having a smaller amplitude than the signal indicated by the broken line S9. The average value of the voltage Vbo2 indicated by the solid line S11 is equal to a voltage Vo2r indicated by a broken line H7, which is lower than the voltage Vbo2l'. With the use of the signals of the opposite phases, the increase in the base voltage Vb2 of the transistors Q2 can be prevented.

Figure 17:
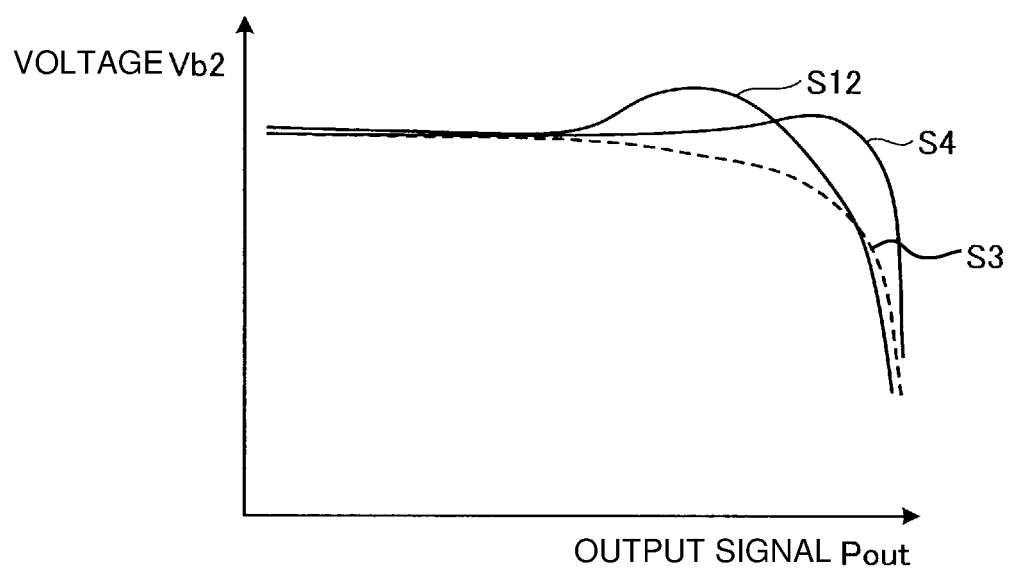
FIG. 17 illustrates an example of the characteristic of an output signal versus the base voltage of transistors.

In some cases, the signal passing through the base-emitter capacitance of the transistors Q2 may be excessively large. For example, a characteristic may be obtained in which a portion of the base voltage Vb2 of the transistors Q2 is increased. FIG. 17 illustrates an example of the characteristic of the output signal Pout versus the base voltage Vb2 of the transistors Q2. Referring to FIG. 17, as indicated by a solid line S12, a portion of the base voltage Vb2 of the transistors Q2 may be increased. In this case, in the fourth embodiment, a signal of a phase opposite to that of the waveform to be applied to the bases of the transistors Q2 is applied to the output section of the second bias circuit 4. Accordingly, their voltage levels are weakened. This can prevent the increase in the base voltage Vb2 of the transistors Q2. As a result, a base voltage Vb2 having the characteristic indicated by the solid line S4 can be obtained.

Figure 18:
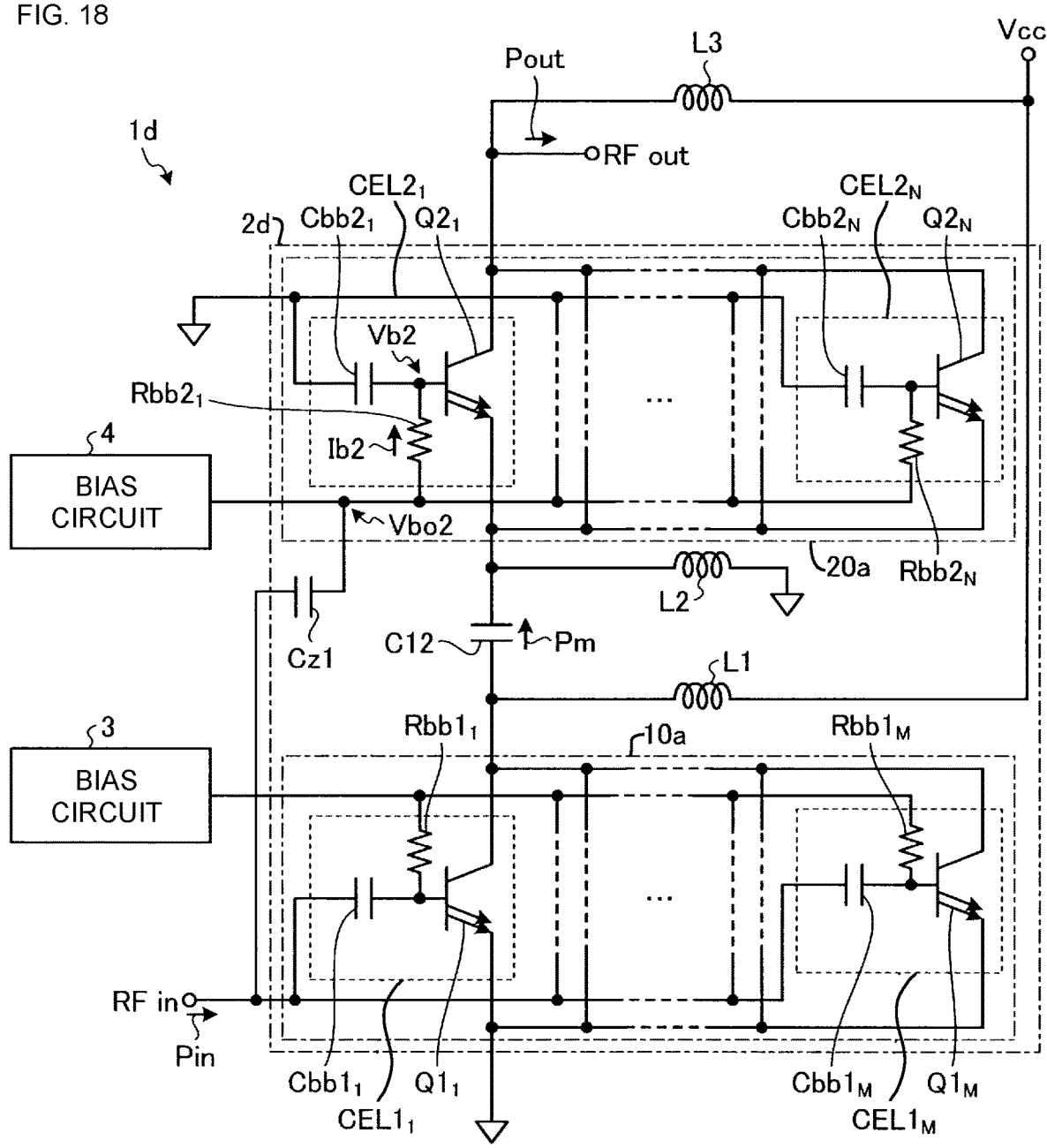
FIG. 18 illustrates an example configuration of the power amplifier illustrated in FIG. 15 that includes the impedance circuit illustrated in FIG. 3.

FIG. 18 illustrates an example configuration of the power amplifier 2d illustrated in FIG. 15 that includes the impedance circuit Z1a illustrated in FIG. 3. In FIG. 18, the power amplifier 2d includes the capacitor Cz1, which serves as an impedance circuit.

In the power amplifier circuit 1d according to the fourth embodiment, even if a signal passing through the base-emitter capacitance of the transistors Q2 is excessively large, the increase in the base voltage Vb2 of the transistors Q2 can be prevented, the transistors Q2 are kept in the on state, the input and output gain characteristics are improved, and the output signal distortion can be reduced.

Fifth Embodiment

Figure 19:
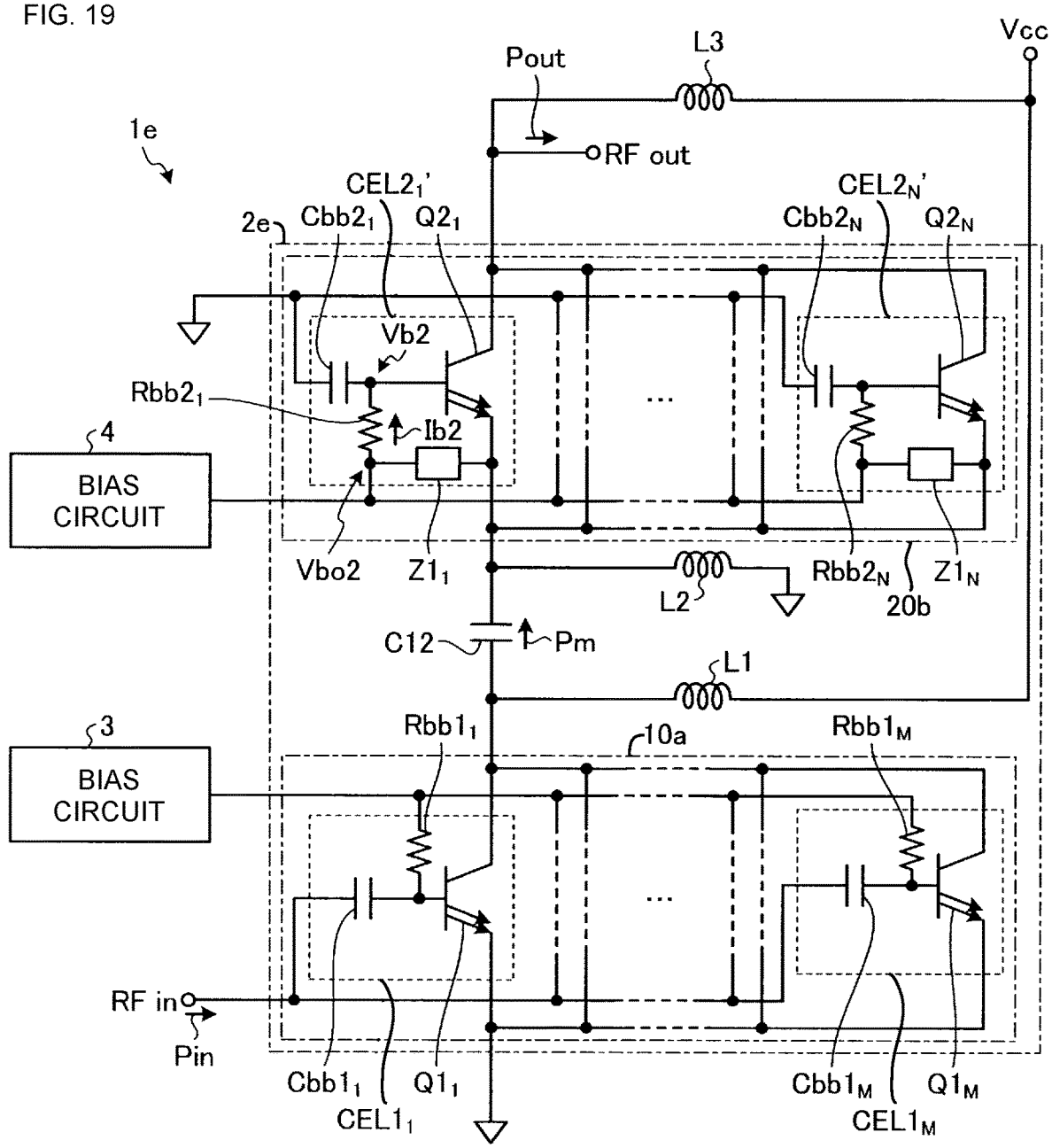
FIG. 19 illustrates the configuration of a power amplifier circuit according to a third embodiment.

FIG. 19 illustrates the configuration of a power amplifier circuit 1e according to a fifth embodiment. In FIG. 19, unlike the power amplifier circuit 1b, the power amplifier circuit 1e includes a power amplifier 2e in place of the power amplifier 2b. The power amplifier 2e includes the first power amplifier 10a, a second power amplifier 20b, and the capacitor C12. The second power amplifier 20b includes N parallel-connected cells $CEL2_1', \ldots,$ and $CEL2_N'$ (N is a natural number). The second power amplifier 20b may include a plurality of (i.e., N≥2) parallel-connected cells, or may include a single cell (i.e., N=1). The cells $CEL2_1', \ldots,$ and $CEL2_N'$ correspond to a "second cell" of the present disclosure. In the following, cells $CEL2_1', \ldots,$ and $CEL2_N'$ are collectively referred to sometimes as "cells CEL2'". The cells $CEL2_1', \ldots,$ and $CEL2_N'$ include transistors $Q2_1, \ldots,$ and $Q2_N$, capacitors $Cbb2_1, \ldots,$ and $Cbb2_N$, and resistors $Rbb2_1, \ldots,$ and $Rbb2_N$, respectively. The cells $CEL2_1', \ldots,$ and $CEL2_N'$ further include impedance circuits $Z1_1, \ldots,$ and $Z1_N$, respectively. In the following, the impedance circuits $Z1_1, \ldots,$ and $Z1_N$ are collectively referred to sometimes as "impedance circuits Z1".

In FIG. 19, first ends of the impedance circuits Z1 of the cells CEL2' are electrically connected to the second ends of the resistors Rbb2. That is, the first ends of the impedance circuits Z1 are electrically connected to the output section of the second bias circuit 4.

Second ends of the impedance circuits Z1 of the cells CEL2' are electrically connected between the second end of the capacitor C12 and the emitters of the transistors Q2. The emitters of the transistors Q2 receive the RF signal Pm from the first power amplifier 10a via the capacitor C12. Accordingly, a portion of the RF signal Pm passing through the capacitor C12 is applied to the output section of the second bias circuit 4 via the impedance circuits Z1. In response to voltages Vbo2 obtained by adding the portion of the RF signal Pm to the outputs of the impedance circuits Z1, currents Ib2 flow through the resistors Rbb2, and the base voltage Vb2 of the transistors Q2 is set. The "portion of the RF signal Pm" corresponds to a "signal corresponding to a radio-frequency input signal" of the present disclosure.

The impedance circuits Z1 are each a circuit that is open for DC and conducting for AC. For example, each of the impedance circuits Z1 has any of the configurations described with reference to FIGS. 3 and 4.

Figure 20:
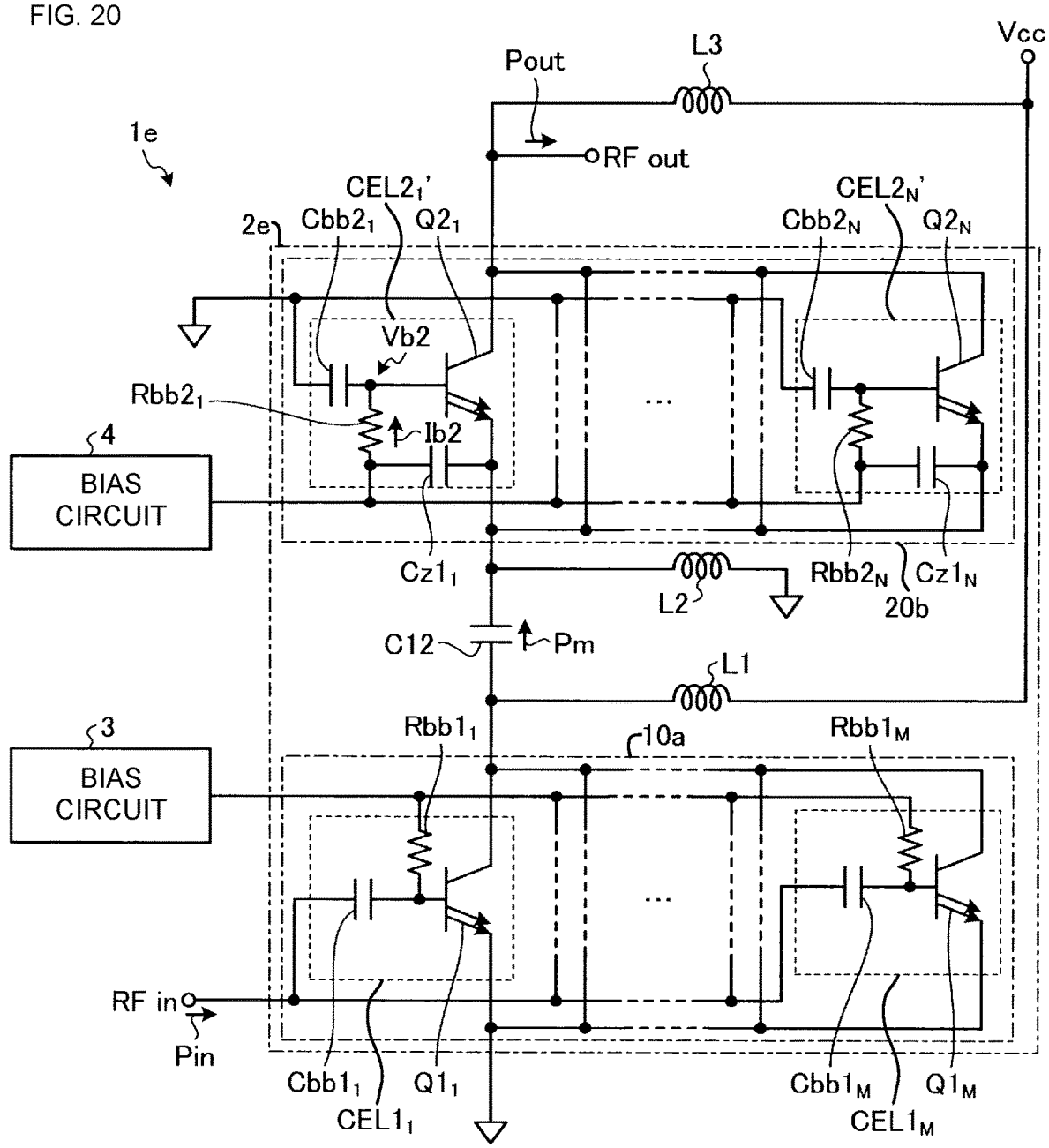
FIG. 20 illustrates an example configuration of the power amplifier illustrated in FIG. 19 that includes the impedance circuit illustrated in FIG. 3.

FIG. 20 illustrates an example configuration of the power amplifier 2e illustrated in the FIG. 19 in which the second power amplifier 20b includes impedance circuits each of which is the impedance circuit Z1a illustrated in FIG. 3. In FIG. 20, the cells $CEL2_1', \ldots,$ and $CEL2_N'$ of the second power amplifier 20b of the power amplifier 2e include capacitors $Cz1_1, \ldots,$ and $Cz1_N$, which serve as impedance circuits, respectively.

Accordingly, as in the first embodiment described above, the reduction in base voltage can be suppressed even during a large-signal operation, the transistors Q2 are kept in the on state, the input and output gain characteristics are improved, and the output signal distortion can be reduced. In addition, since the cells CEL2' include the impedance circuits Z1, the constants of elements constituting the impedance circuits Z1 can be adjusted in accordance with a deviation of the amplification characteristics of the respective cells caused by the arrangement of the cells. A distortion can be more accurately corrected.

Sixth Embodiment

An additional impedance circuit may be provided for the output section of the first bias circuit 3. For example, in the power amplifier 2b illustrated in FIG. 11, an additional impedance circuit may be provided for the output section of the first bias circuit 3.

Figure 21:
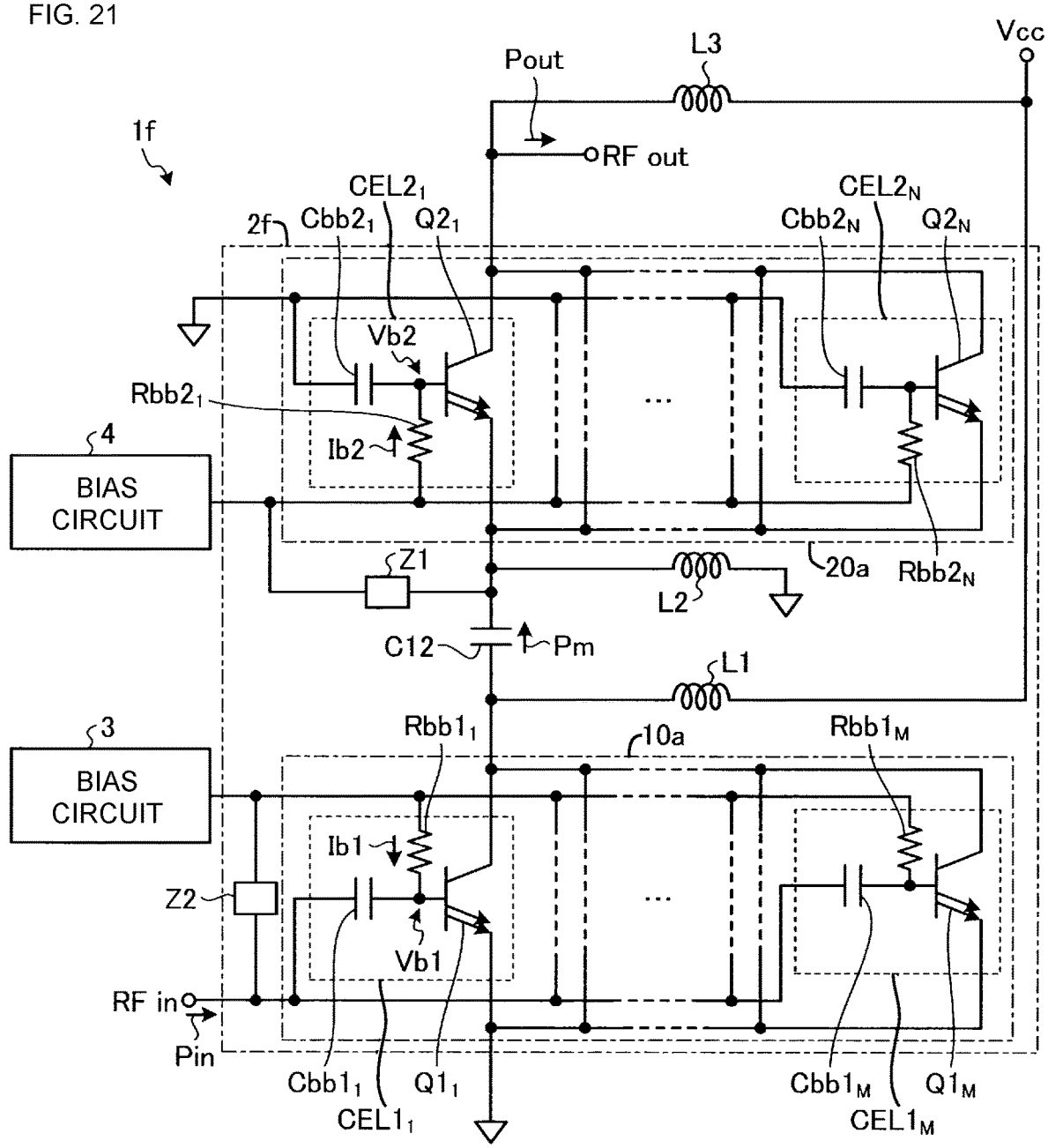
FIG. 21 illustrates the configuration of a power amplifier circuit according to a sixth embodiment.

FIG. 21 illustrates the configuration of a power amplifier circuit 1f according to a sixth embodiment. In FIG. 21, unlike the power amplifier circuit 1b, the power amplifier circuit 1f includes a power amplifier 2f in place of the power amplifier 2b. Unlike the power amplifier 2b illustrated in FIG. 11, the power amplifier 2f has a configuration including an additional impedance circuit Z2.

The impedance circuit Z2 has a first end electrically connected to the output section of the first bias circuit 3. A second end of the impedance circuit Z2 is electrically connected to the input terminal RFin of the RF input signal Pin. The impedance circuit Z2 may be implemented using the impedance circuit Z1a or Z1b described with reference to FIG. 3 or 4. With the use of the impedance circuit Z2, the reduction in the base voltage of the transistors Q1 can be suppressed. Accordingly, both the transistors Q1 and Q2 are kept in the on state, the input and output gain characteristics are improved, and the output signal distortion can be reduced.

Seventh Embodiment

For example, in the power amplifier 2d illustrated in FIG. 15, an additional impedance circuit may be provided for the output section of the first bias circuit 3.

Figure 22:
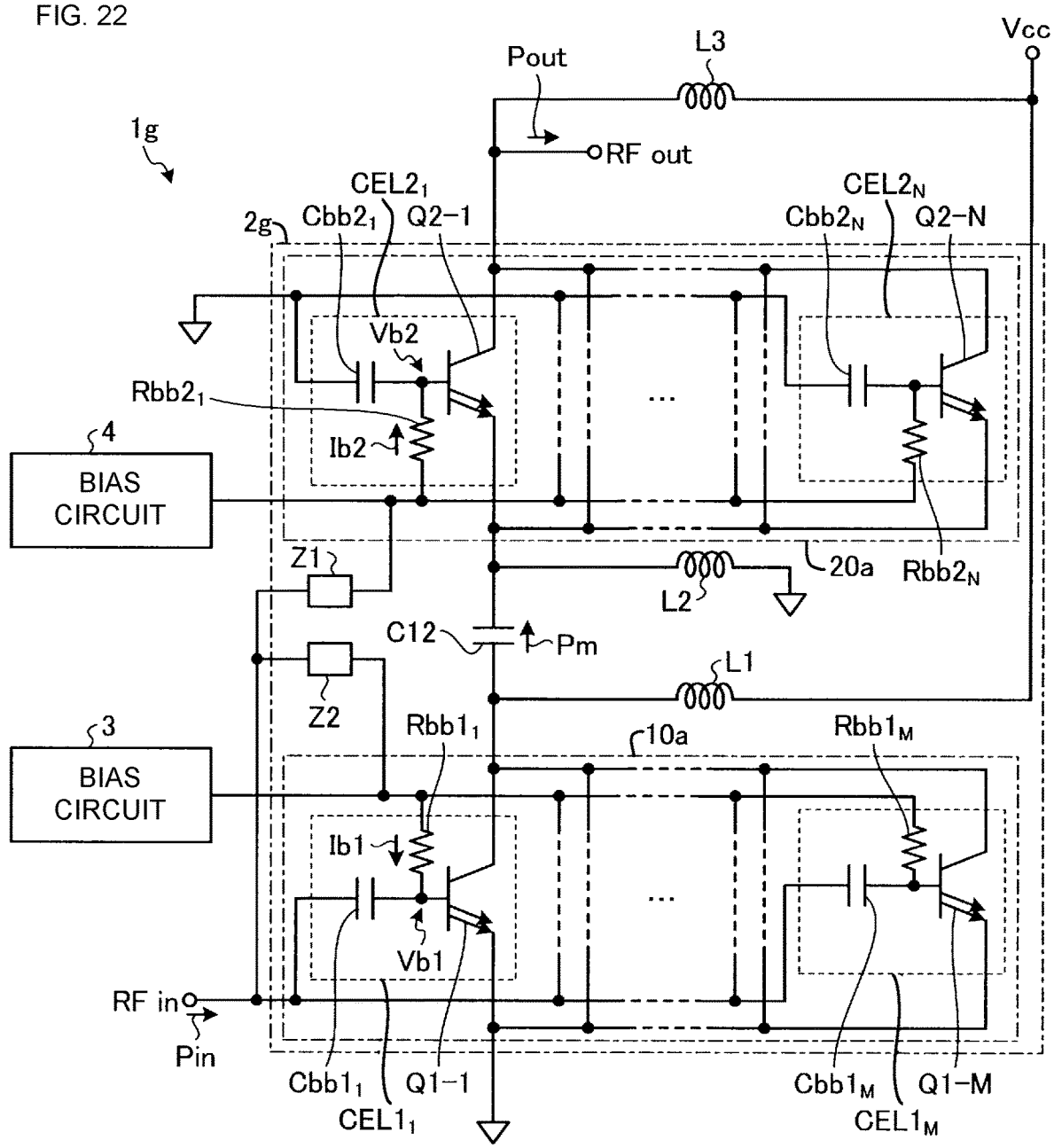
FIG. 22 illustrates the configuration of a power amplifier circuit according to a seventh embodiment.

FIG. 22 illustrates the configuration of a power amplifier circuit 1g according to a seventh embodiment. In FIG. 22, unlike the power amplifier circuit 1d, the power amplifier circuit 1g includes a power amplifier 2g in place of the power amplifier 2d. Unlike the power amplifier 2d illustrated in FIG. 15, the power amplifier 2g has a configuration including an additional impedance circuit Z2.

The impedance circuit Z2 has a first end electrically connected to the output section of the first bias circuit 3. A second end of the impedance circuit Z2 is electrically connected to the input terminal RFin of the RF input signal Pin. The impedance circuit Z2 may be implemented using the impedance circuit Z1a or Z1b described with reference to FIG. 3 or 4. With the use of the impedance circuit Z2, the reduction in the base voltage of the transistors Q1 can be suppressed. Accordingly, both the transistors Q1 and Q2 are kept in the on state, the input and output gain characteristics are improved, and the output signal distortion can be reduced.

Eighth Embodiment

Figure 23:
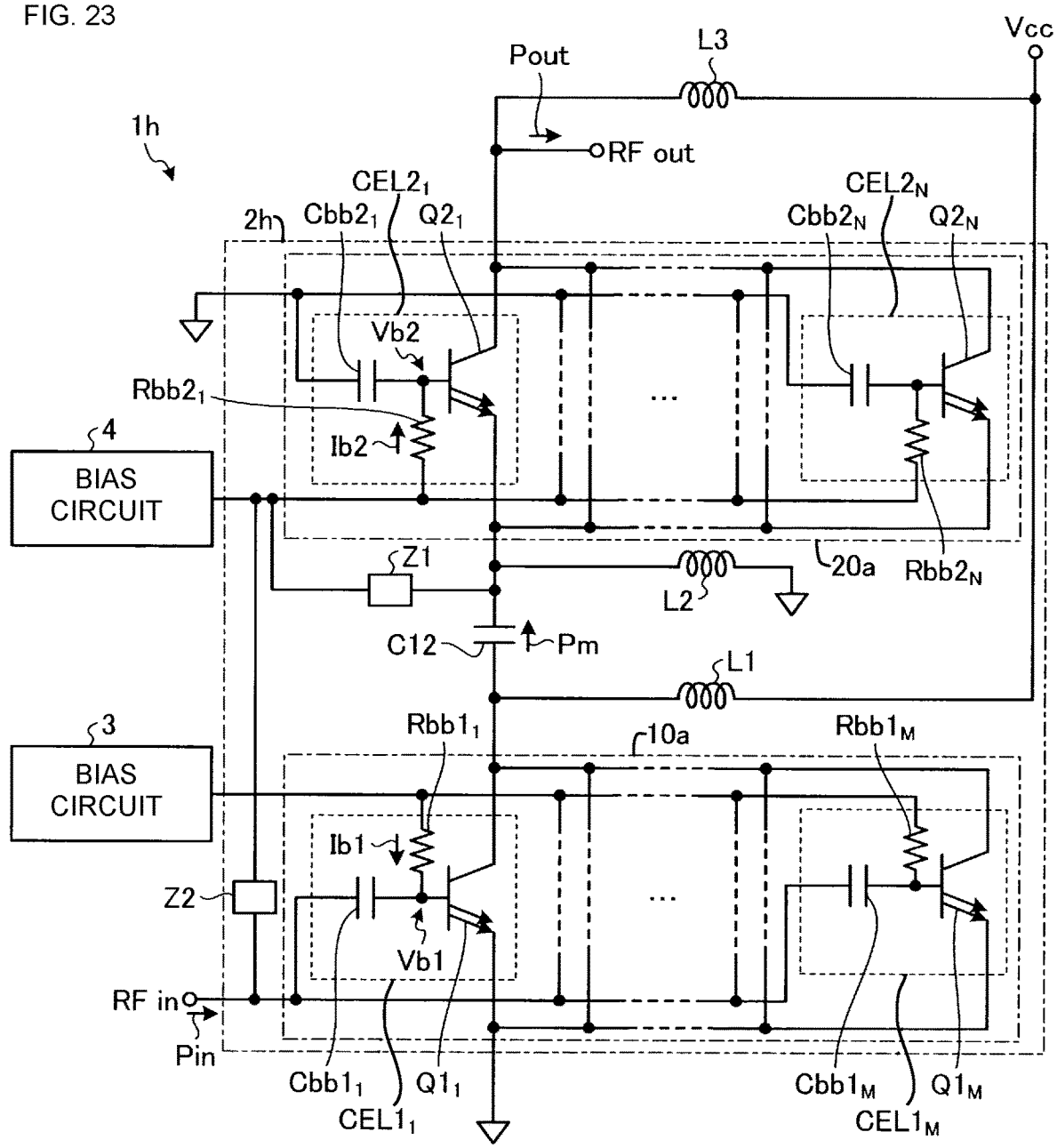
FIG. 23 illustrates the configuration of a power amplifier circuit according to an eighth embodiment.

A configuration may be available that suppresses the reduction in the base voltage Vb2 of the transistors Q2 and that prevents the increase in the base voltage Vb2 of the transistors Q2. FIG. 23 illustrates the configuration of a power amplifier circuit 1h according to an eighth embodiment. In FIG. 23, the power amplifier circuit 1h is configured such that the power amplifier circuit 1b is provided with an additional impedance circuit Z2.

In FIG. 23, the impedance circuit Z2 has a first end electrically connected to the output section of the second bias circuit 4. A second end of the impedance circuit Z2 is connected to the input terminal RFin. The impedance circuit Z2 may be implemented using the impedance circuit Z1a or Z1b described with reference to FIG. 3 or 4.

With the use of the impedance circuit Z1 and the impedance circuit Z2, the reduction in the base voltage Vb2 of the transistors Q2 can be suppressed, and the increase in the base voltage Vb2 of the transistors Q2 can be prevented. Accordingly, the transistors Q2 are kept in the on state, the input and output gain characteristics are improved, and the output signal distortion can be reduced.

Ninth Embodiment

The capacitor C12 may not be disposed between the first power amplifier 10a and the second power amplifier 20a, and the first power amplifier 10a and the second power amplifier 20a may be cascode-connected. In this case, the first inductor L1 and the second inductor L2 are omitted.

Figure 24:
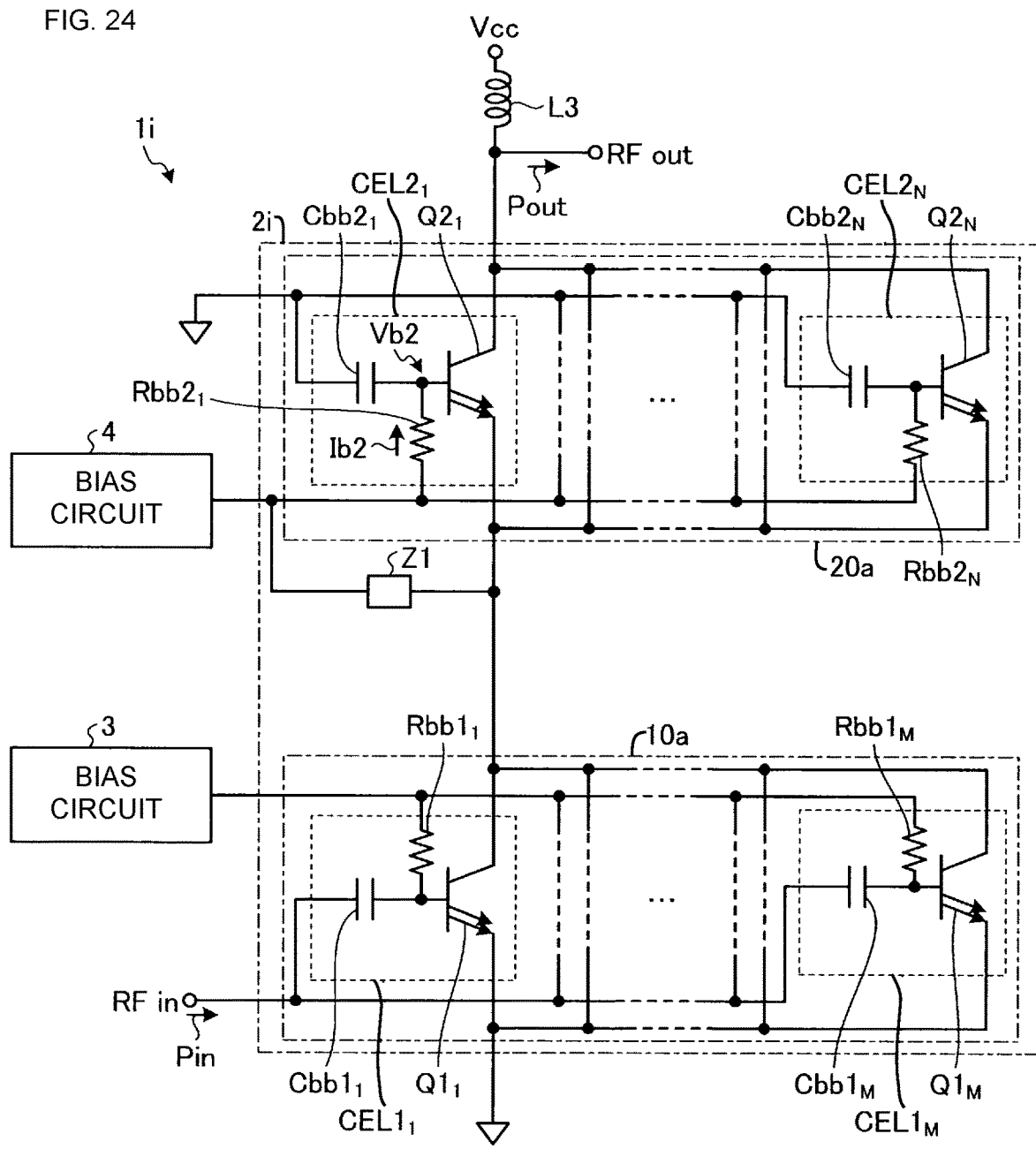
FIG. 24 illustrates the configuration of a power amplifier circuit according to a ninth embodiment.

FIG. 24 illustrates the configuration of a power amplifier circuit 1i according to a ninth embodiment. In FIG. 24, unlike the power amplifier circuit 1b, the power amplifier circuit 1i includes a power amplifier 2i in place of the power amplifier 2b. The power amplifier 2i includes the first power amplifier 10a, the second power amplifier 20a, and the impedance circuit Z1, and does not include the capacitor C12, the first inductor L1, and the second inductor L2.

In FIG. 24, the first end of the impedance circuit Z1 is electrically connected to the output section of the second bias circuit 4. The second end of the impedance circuit Z1 is electrically connected to the collectors of the transistors Q1. A portion of an RF signal outputted from the collectors of the transistors Q1 is applied to the output section of the second bias circuit 4 via the impedance circuit Z1. Accordingly, a voltage Vbo2 obtained by adding the portion of the RF signal to the output of the second bias circuit 4 is inputted to the second power amplifier 20a. In response to the voltage Vbo2 being inputted to the second power amplifier 20a, a current Ib2 flows through the resistors Rbb2, and the base voltage Vb2 of the transistors Q2 is set. The "portion of the RF signal" corresponds to a "signal corresponding to a radio-frequency input signal" of the present disclosure.

The impedance circuit Z1 illustrated in FIG. 24 may be implemented using the impedance circuit Z1a or Z1b described with reference to FIG. 3 or 4.

The impedance circuit Z1a illustrated in FIG. 3 is constituted by the capacitor Cz1. Accordingly, the impedance circuit Z1a is a circuit that is open for DC and conducting for AC. With the use of the impedance circuit Z1a as the impedance circuit Z1 illustrated in FIG. 24, the capacitor Cz1 is connected in series between the output section of the second bias circuit 4 and the emitters of the transistors Q2. With the use of the impedance circuit Z1a, the reduction in the base voltage of the transistors Q2 can be suppressed, the transistors Q2 are kept in the on state, the input and output gain characteristics are improved, and the output signal distortion can be reduced.

The impedance circuit Z1b illustrated in FIG. 4 is a series circuit of the capacitor Cz1 and the inductor Lz1. Accordingly, the impedance circuit Z1b is a circuit that is open for DC and conducting for AC. With the use of the impedance circuit Z1b as the impedance circuit Z1 illustrated in FIG. 24, the capacitor Cz1 and the inductor Lz1 are connected in series between the output section of the second bias circuit 4 and the emitters of the transistors Q2. With the use of the impedance circuit Z1b, the reduction in the base voltage of the transistors Q2 can be suppressed, the transistors Q2 are kept in the on state, the input and output gain characteristics are improved, and the output signal distortion can be reduced.

Figure 25:
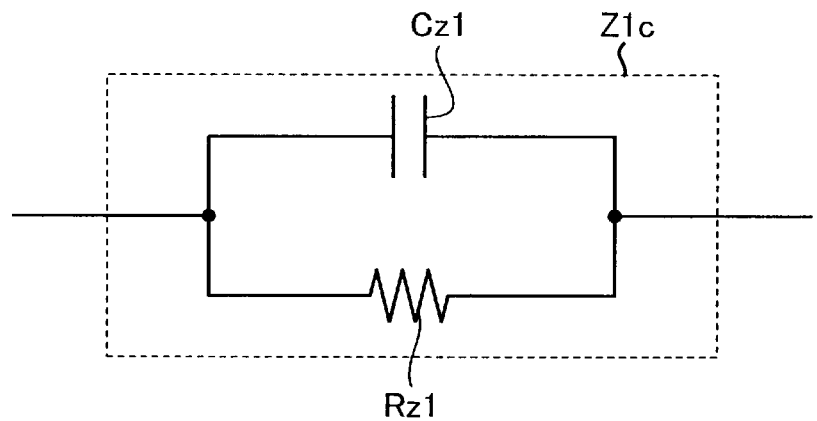
FIG. 25 illustrates another example configuration of an impedance circuit illustrated in FIG. 24.
Figure 26:
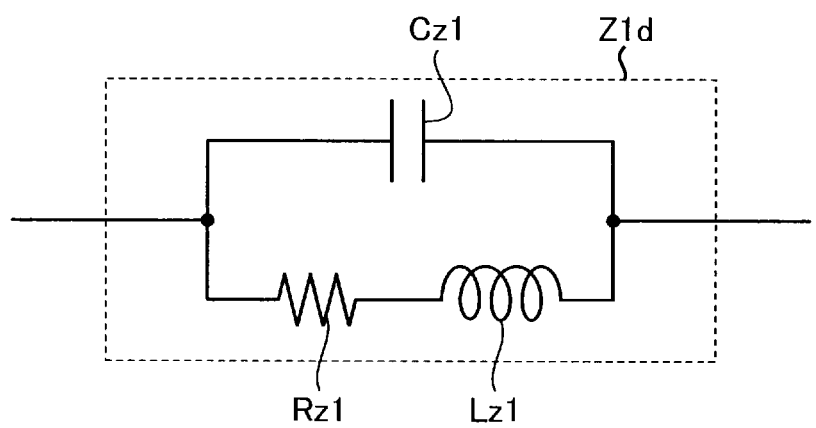
FIG. 26 illustrates another example configuration of the impedance circuit illustrated in FIG. 24.
Figure 27:
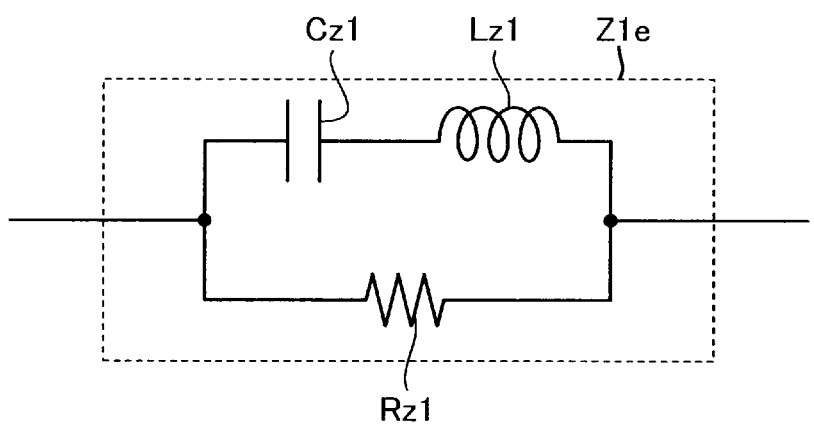
FIG. 27 illustrates another example configuration of the impedance circuit illustrated in FIG. 24.

The impedance circuit Z1 illustrated in FIG. 24 may have any other configuration. FIGS. 25 to 27 illustrate other example configurations of the impedance circuit Z1 illustrated in FIG. 24.

In FIG. 25, an impedance circuit Z1c is a parallel circuit of a capacitor Cz1 and a resistor Rz1. The impedance circuit Z1c is conducting for DC, unlike the impedance circuits Z1a and Z1b. With the use of the impedance circuit Z1c as the impedance circuit Z1 illustrated in FIG. 24, the parallel circuit of the capacitor Cz1 and the resistor Rz1 is connected between the output section of the second bias circuit 4 and the emitters of the transistors Q2. With the use of the impedance circuit Z1c, the reduction in the base voltage of the transistors Q2 can be suppressed, the transistors Q2 are kept in the on state, the input and output gain characteristics are improved, and the output signal distortion can be reduced.

In FIG. 26, an impedance circuit Z1d is a parallel circuit of a capacitor Cz1 and a series connection of a resistor Rz1 and an inductor Lz1. The impedance circuit Z1d is conducting for DC, unlike the impedance circuits Z1a and Z1b. With the use of the impedance circuit Z1d as the impedance circuit Z1 illustrated in FIG. 24, the parallel circuit of the capacitor Cz1 and a series connection of the resistor Rz1 and the inductor Lz1 is connected between the output section of the second bias circuit 4 and the emitters of the transistors Q2. With the use of the impedance circuit Z1d, the reduction in the base voltage of the transistors Q2 can be suppressed, the transistors Q2 are kept in the on state, the input and output gain characteristics are improved, and the output signal distortion can be reduced.

In FIG. 27, an impedance circuit Z1e is a parallel circuit of a resistor Rz1 and a series connection of a capacitor Cz1 and an inductor Lz1. The impedance circuit Z1e is conducting for DC, unlike the impedance circuits Z1a and Z1b. With the use of the impedance circuit Z1e as the impedance circuit Z1 illustrated in FIG. 24, the parallel circuit of the resistor Rz1 and a series connection of the capacitor Cz1 and the inductor Lz1 is connected between the output section of the second bias circuit 4 and the emitters of the transistors Q2. With the use of the impedance circuit Z1e, the reduction in the base voltage of the transistors Q2 can be suppressed, the transistors Q2 are kept in the on state, the input and output gain characteristics are improved, and the output signal distortion can be reduced.

Tenth Embodiment

Figure 28:
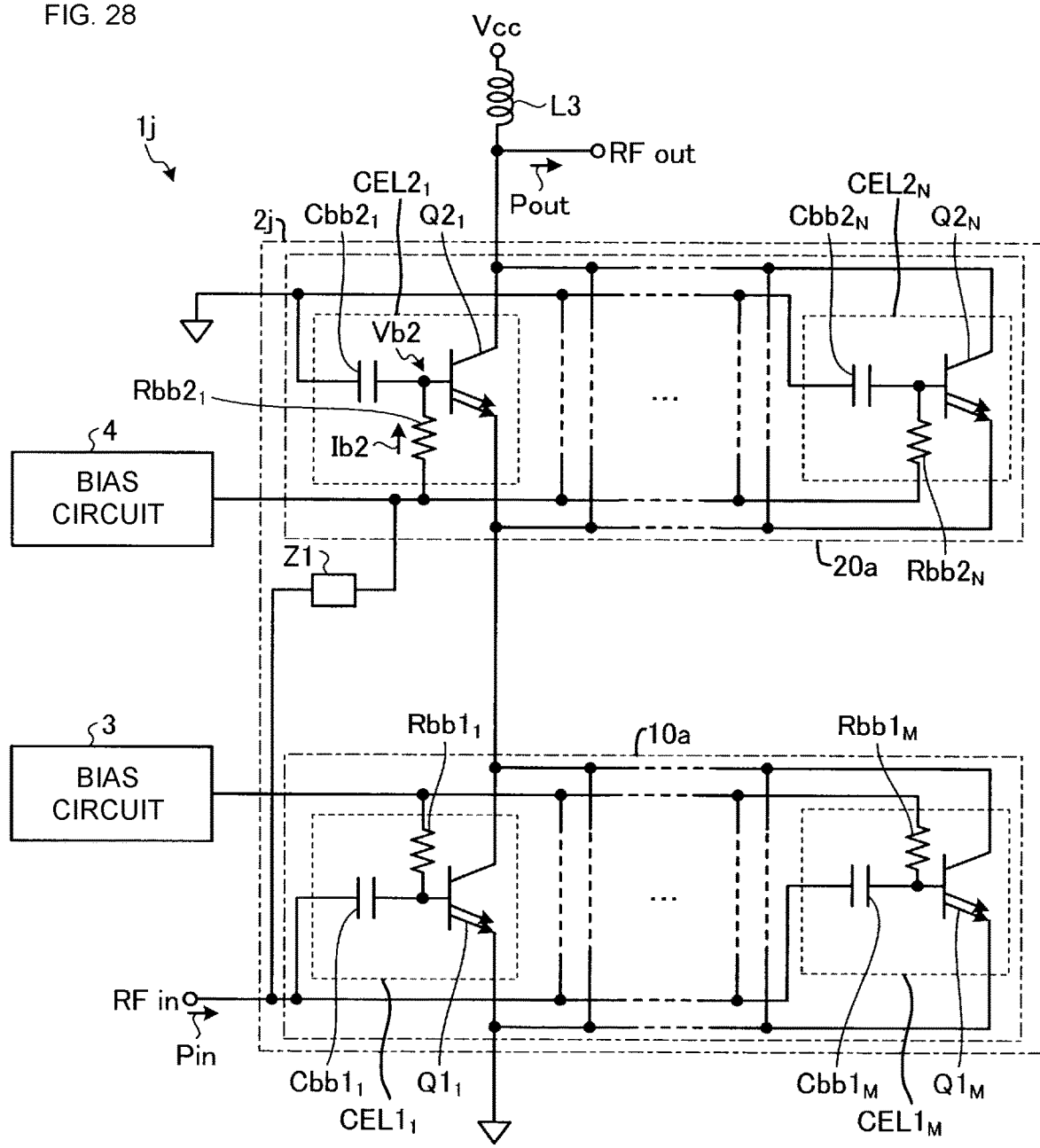
FIG. 28 illustrates the configuration of a power amplifier circuit according to a tenth embodiment.

FIG. 28 illustrates the configuration of a power amplifier circuit 1j according to a tenth embodiment. In FIG. 28, unlike the power amplifier circuit 1d, the power amplifier circuit 1j includes a power amplifier 2j in place of the power amplifier 2d. The power amplifier 2i includes the first power amplifier 10a, the second power amplifier 20a, and the impedance circuit Z1, and does not include the capacitor C12, the first inductor L1, and the second inductor L2.

In FIG. 28, the first end of the impedance circuit Z1 is electrically connected to the output section of the second bias circuit 4. The second end of the impedance circuit Z1 is connected to the input terminal RFin. A portion of the input signal Pin inputted to the input terminal RFin is applied to the output section of the second bias circuit 4 via the impedance circuit Z1. Accordingly, a voltage Vbo2 obtained by adding the portion of the input signal Pin to the output of the impedance circuit Z1 is inputted to the second power amplifier 20a. In response to the voltage Vbo2 being inputted to the second power amplifier 20a, a current Ib2 flows through the resistors Rbb2, and the base voltage Vb2 of the transistors Q2 is set. The "portion of the input signal Pin" corresponds to a "signal corresponding to a radio-frequency input signal" of the present disclosure.

The impedance circuit Z1 illustrated in FIG. 28 may be implemented using, for example, any of the impedance circuits Z1a to Z1e described with reference to FIGS. 3, 4, and 25 to 27. With the use of any of the impedance circuits Z1a to Z1e as the impedance circuit Z1 illustrated in FIG. 28, the reduction in the base voltage of the transistors Q2 can be suppressed, the transistors Q2 are kept in the on state, the input and output gain characteristics are improved, and the output signal distortion can be reduced.

Eleventh Embodiment

Figure 29:
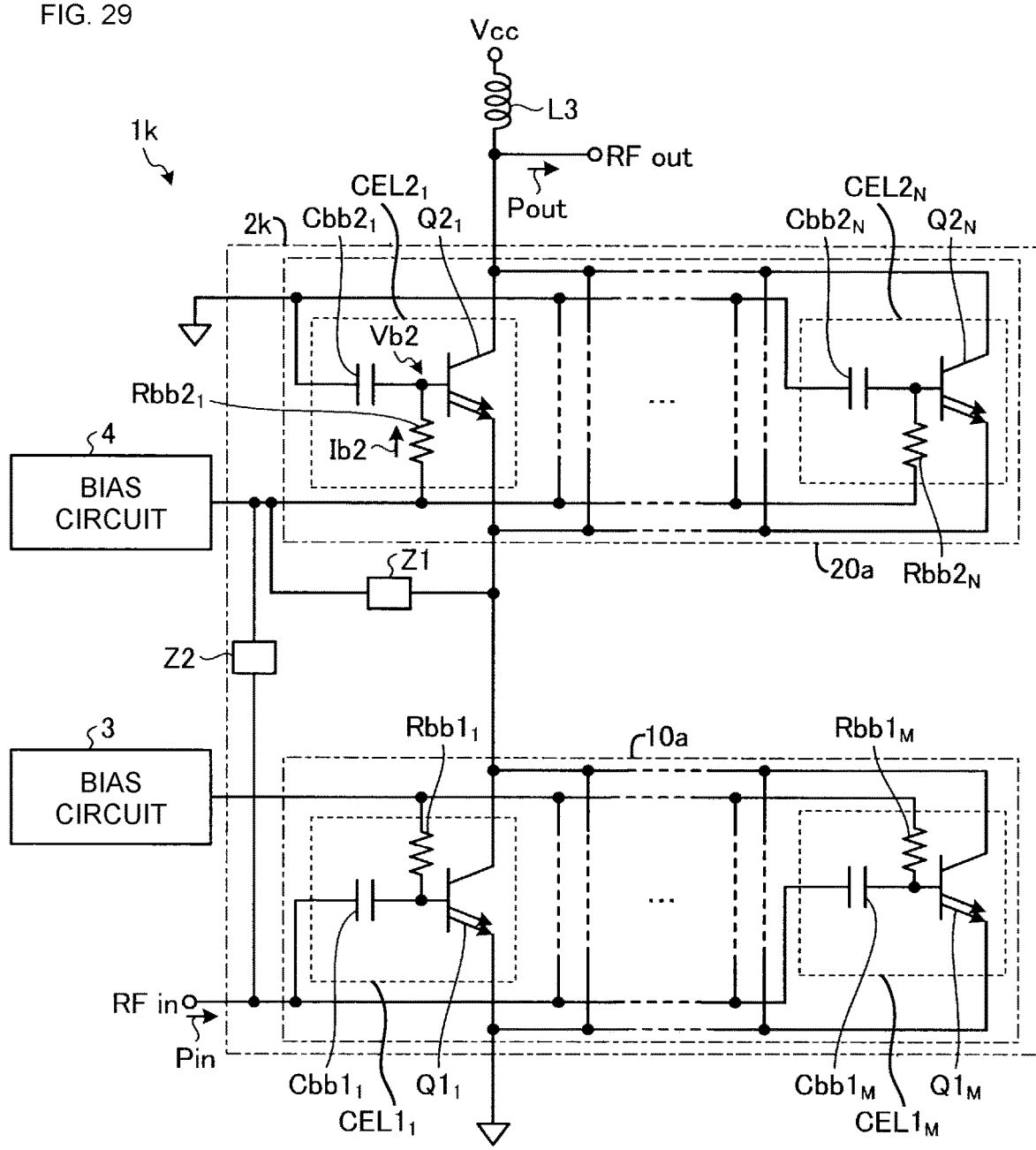
FIG. 29 illustrates the configuration of a power amplifier circuit according to an eleventh embodiment.

FIG. 29 illustrates the configuration of a power amplifier circuit 1k according to an eleventh embodiment. In FIG. 29, the power amplifier circuit 1k includes a power amplifier 2k. The power amplifier 2k is configured such that the power amplifier 2i is provided with an additional impedance circuit Z2. The impedance circuit Z2 has a first end electrically connected to the output section of the second bias circuit 4. A second end of the impedance circuit Z2 is connected to the input terminal RFin. A portion of the input signal Pin inputted to the input terminal RFin is applied to the output section of the second bias circuit 4 via the impedance circuit Z2. The impedance circuit Z2 may be implemented using, for example, any one of the impedance circuits Z1a to Z1e described with reference to FIGS. 3, 4, and 25 to 27.

With the use of the impedance circuit Z1 and the impedance circuit Z2, the reduction in the base voltage Vb2 of the transistors Q2 can be suppressed, and the increase in the base voltage Vb2 of the transistors Q2 can be prevented. Accordingly, the transistors Q2 are kept in the on state, the input and output gain characteristics are improved, and the output signal distortion can be reduced.

As described above, in a power amplifier circuit, a signal corresponding to a radio-frequency input signal is applied to a path extending from the second bias circuit 4 to the base or bases of the transistor or transistors Q2 via an impedance circuit, thereby improving the input and output gain characteristics and reducing output signal distortion.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   a first bias circuit configured to provide a first bias;
   a second bias circuit configured to provide a second bias;
   a first transistor having an emitter electrically connected to a reference potential, a base configured to receive the first bias via a first resistor and to receive a radio-frequency input signal via a first capacitor, and a collector configured to output a first radio-frequency signal obtained by amplifying the radio-frequency input signal;

a second transistor having a base electrically connected to the reference potential via a second capacitor and configured to receive the second bias via a second resistor, a collector electrically connected to a first power supply potential via a third inductor, and an emitter configured to receive the first radio-frequency signal, the collector being configured to output a second radio-frequency output signal obtained by amplifying the first radio-frequency signal; and a first impedance circuit having a first end electrically connected to an output section of the second bias circuit, the first impedance circuit being configured to apply a signal corresponding to the radio-frequency input signal to a path extending from the second bias circuit to the base of the second transistor.

2. The power amplifier circuit according to claim 1, further comprising a third capacitor having a first end electrically connected to the collector of the first transistor and a second end electrically connected to the emitter of the second transistor, wherein the collector of the first transistor is electrically connected to the first power supply potential via a first inductor, and the emitter of the second transistor is electrically connected to the reference potential via a second inductor.

3. The power amplifier circuit according to claim 2, wherein the first impedance circuit is a circuit that is open for direct current and conducting for alternating current.

4. The power amplifier circuit according to claim 1, wherein the first impedance circuit further has a second end electrically connected to the emitter of the second transistor.

5. The power amplifier circuit according to claim 2, wherein the first impedance circuit further has a second end electrically connected to the emitter of the second transistor.

6. The power amplifier circuit according to claim 3, wherein the first impedance circuit further has a second end electrically connected to the emitter of the second transistor.

7. The power amplifier circuit according to claim 4, further comprising a plurality of cells each including the second transistor, the second resistor, the second capacitor, and the first impedance circuit.

8. The power amplifier circuit according to claim 5, further comprising a plurality of cells each including the second transistor, the second resistor, the second capacitor, and the first impedance circuit.

9. The power amplifier circuit according to claim 6, further comprising a plurality of cells each including the second transistor, the second resistor, the second capacitor, and the first impedance circuit.

10. The power amplifier circuit according to claim 2, wherein the first impedance circuit further has a second end electrically connected to the collector of the first transistor.

11. The power amplifier circuit according to claim 3, wherein the first impedance circuit further has a second end electrically connected to the collector of the first transistor.

12. The power amplifier circuit according to claim 1, wherein the first impedance circuit further has a second end electrically connected to an input section of the amplified radio-frequency input signal.

13. The power amplifier circuit according to claim 2, wherein the first impedance circuit further has a second end electrically connected to an input section of the amplified radio-frequency input signal.

14. The power amplifier circuit according to claim 3, wherein the first impedance circuit further has a second end electrically connected to an input section of the amplified radio-frequency input signal.

15. The power amplifier circuit according to claim 2, further comprising a second impedance circuit having a first end electrically connected to an output section of the first bias circuit and a second end electrically connected to the input section of the radio-frequency input signal.

16. The power amplifier circuit according to claim 12, further comprising a second impedance circuit having a first end electrically connected to an output section of the first bias circuit and a second end electrically connected to the input section of the radio-frequency input signal.

17. The power amplifier circuit according to claim 1, wherein the first impedance circuit further has a second end electrically connected to the emitter of the second transistor, and the power amplifier circuit further comprises a second impedance circuit having a first end electrically connected to the output section of the second bias circuit and a second end electrically connected to an input section of the radio-frequency input signal.

18. The power amplifier circuit according to claim 2, wherein the first impedance circuit further has a second end electrically connected to the emitter of the second transistor, and the power amplifier circuit further comprises a second impedance circuit having a first end electrically connected to the output section of the second bias circuit and a second end electrically connected to an input section of the radio-frequency input signal.

19. The power amplifier circuit according to claim 16, wherein the first end of the second impedance circuit is electrically connected to the second end of the first impedance circuit.

* * * * *

UNITED STATES PATENT AND TRADEMARK OFFICE
CERTIFICATE OF CORRECTION

| | | |
|---|---|---|
| PATENT NO. | : 11,469,715 B2 | Page 1 of 1 |
| APPLICATION NO. | : 17/109389 | |
| DATED | : October 11, 2022 | |
| INVENTOR(S) | : Jun Enomoto et al. | |

It is certified that error appears in the above-identified patent and that said Letters Patent is hereby corrected as shown below:

In the Specification

Column 15, Line 19, "if" should be -- 1f --.

Column 15, Line 20, "if" should be -- 1f --.

Signed and Sealed this
Fourth Day of July, 2023

Katherine Kelly Vidal
*Director of the United States Patent and Trademark Office*